United States Patent
Murai et al.

(10) Patent No.: US 11,063,109 B2
(45) Date of Patent: *Jul. 13, 2021

(54) DISPLAY UNIT

(71) Applicant: JOLED INC., Tokyo (JP)

(72) Inventors: Atsuhito Murai, Tokyo (JP); Yasuhiro Terai, Tokyo (JP); Takashi Maruyama, Tokyo (JP); Yoshihiro Oshima, Tokyo (JP); Motohiro Toyota, Tokyo (JP); Ryosuke Ebihara, Tokyo (JP); Yasunobu Hiromasu, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/830,289

(22) Filed: Mar. 26, 2020

(65) Prior Publication Data

US 2020/0227511 A1    Jul. 16, 2020

Related U.S. Application Data

(63) Continuation of application No. 16/112,770, filed on Aug. 27, 2018, now Pat. No. 10,644,093.

(30) Foreign Application Priority Data

Sep. 8, 2017   (JP) .............................. JP2017-172654

(51) Int. Cl.
| | |
|---|---|
| *H01L 27/32* | (2006.01) |
| *H01L 51/52* | (2006.01) |
| *H01L 29/417* | (2006.01) |
| *H01L 29/423* | (2006.01) |
| *H01L 29/786* | (2006.01) |
| *H01L 27/12* | (2006.01) |

(52) U.S. Cl.
CPC ...... *H01L 27/3276* (2013.01); *H01L 27/3262* (2013.01); *H01L 27/3265* (2013.01);
(Continued)

(58) Field of Classification Search
CPC ............ H01L 27/3276; H01L 27/3262; H01L 51/5246; H01L 27/3265; H01L 27/1225
See application file for complete search history.

(56) References Cited

U.S. PATENT DOCUMENTS 10,644,093 B2 *  5/2020  Murai ................ H01L 51/5246
2003/0057450 A1    3/2003  Arao
(Continued)

FOREIGN PATENT DOCUMENTS

| JP | H5150263 A | 6/1993 |
| JP | 200398549 A | 4/2003 |

(Continued)

*Primary Examiner* — Dung A. Le
(74) *Attorney, Agent, or Firm* — Hauptman Ham, LLP

(57) ABSTRACT

A display unit includes a first substrate, a transistor, first and second wiring layers, and an insulating film. The first substrate is provided with a display region and a peripheral region. The transistor is provided in the display region, and includes a semiconductor layer, a gate electrode facing the semiconductor layer, a gate insulating film between the gate electrode and the semiconductor layer, and a source-drain electrode electrically coupled to the semiconductor layer. The first wiring layer is provided in the peripheral region, electrically coupled to the transistor, and disposed closer to the first substrate than the same layer as the gate electrode and the source-drain electrode. The second wiring layer is provided on the first substrate and has an electric potential different from the first wiring layer. The insulating film is provided between the second wiring layer and the first wiring layer.

20 Claims, 19 Drawing Sheets

(52) U.S. Cl.
CPC .. *H01L 29/41733* (2013.01); *H01L 29/42384* (2013.01); *H01L 29/78633* (2013.01); *H01L 51/5246* (2013.01); *H01L 27/1225* (2013.01); *H01L 27/1244* (2013.01); *H01L 27/1255* (2013.01); *H01L 29/7869* (2013.01); *H01L 2251/5392* (2013.01)

(56) References Cited

U.S. PATENT DOCUMENTS

| | | |
|---|---|---|
| 2003/0129790 A1 | 7/2003 | Yamazaki et al. |
| 2006/0061269 A1 | 3/2006 | Tsuchiya et al. |
| 2011/0156026 A1 | 6/2011 | Yamazaki et al. |
| 2014/0217397 A1 | 8/2014 | Kwak et al. |
| 2016/0179229 A1 | 6/2016 | Ahn |
| 2017/0125604 A1 | 5/2017 | Oshima |
| 2017/0148856 A1 | 5/2017 | Choi et al. |

FOREIGN PATENT DOCUMENTS

| | | |
|---|---|---|
| JP | 200447410 A | 2/2004 |
| JP | 2005-302707 A | 10/2005 |
| JP | 2005285976 A | 10/2005 |
| JP | 2006114493 A | 4/2006 |
| JP | 2012252033 A | 12/2012 |
| KR | 10-2008-0052709 A | 6/2008 |
| KR | 10-2017-0059864 A | 5/2017 |
| WO | 2016009715 A1 | 1/2016 |

\* cited by examiner

DISPLAY UNIT

CROSS REFERENCE TO RELATED APPLICATIONS

This is a continuation of U.S. application Ser. No. 16/112,770, filed Aug. 27, 2018, which claims the benefit of Japanese Priority Patent Application JP 2017-172654 filed on Sep. 8, 2017, the entire contents of which are incorporated herein by reference.

BACKGROUND

The technology relates to a display unit including a transistor in a display region.

A display unit is provided with, for example, a display element such as an organic electro luminescence (EL) element in a display region. For example, reference is made to Japanese Unexamined Patent Application Publication No. 2005-302707. A transistor that drives the display element is disposed in the display region, and wiring lines each electrically coupled to the transistor are led to a peripheral region outside the display region.

In the peripheral region, a plurality of wiring lines having electric potentials different from one another are stacked, with an insulating film being interposed therebetween.

SUMMARY

Such a display unit is requested to enhance a degree of freedom in designing wiring lines provided in a peripheral region.

It is desirable to provide a display unit that makes it possible to enhance a degree of freedom in designing wiring lines provided in a peripheral region.

A display unit according to an embodiment of the technology includes a first substrate, a transistor, a first wiring layer, a second wiring layer, and an insulating film. The first substrate is provided with a display region and a peripheral region outside the display region. The transistor is provided in the display region on the first substrate. The transistor includes a semiconductor layer, a gate electrode that faces the semiconductor layer, a gate insulating film located between the gate electrode and the semiconductor layer, and a source-drain electrode electrically coupled to the semiconductor layer. The first wiring layer is provided in the peripheral region on the first substrate. The first wiring layer is electrically coupled to the transistor and is disposed at a position closer to the first substrate than a position in the same layer as the gate electrode and the source-drain electrode of the transistor. The second wiring layer is provided on the first substrate. The second wiring layer has an electric potential that is different from an electric potential of the first wiring layer. The insulating film is provided between the second wiring layer and the first wiring layer.

BRIEF DESCRIPTION OF THE DRAWINGS

The accompanying drawings are included to provide a further understanding of the disclosure, and are incorporated in and constitute a part of this specification. The drawings illustrate example embodiments and, together with the specification, serve to explain the principles of the technology.

DETAILED DESCRIPTION

Figure 1:
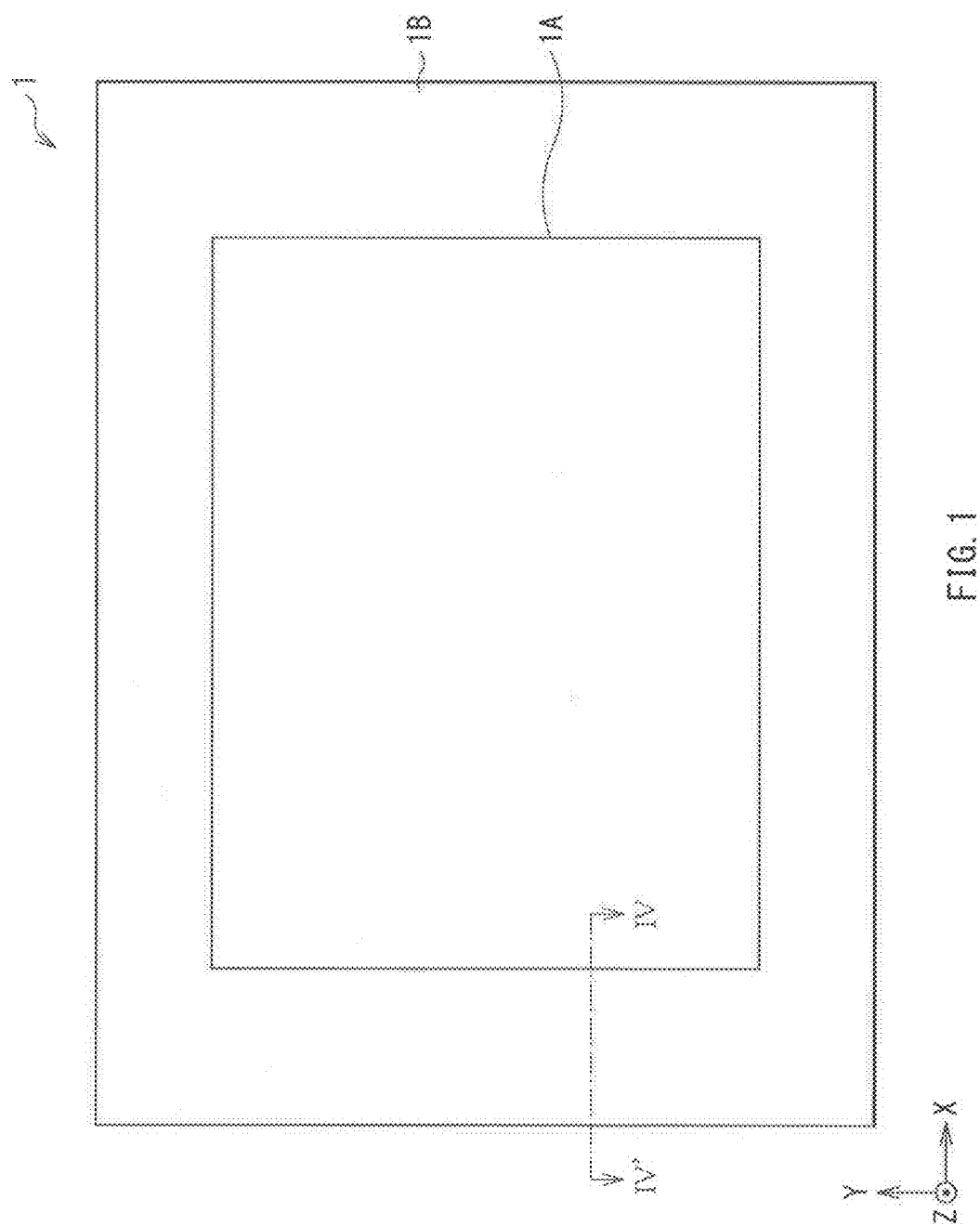
FIG. 1 is a schematic plan view of an outline configuration of a display unit according to one embodiment of the disclosure.

Some example embodiments of the technology are described below in detail with reference to the accompanying drawings.

It is to be noted that the following description is directed to illustrative examples of the technology and not to be construed as limiting to the technology. Factors including, without limitation, numerical values, shapes, materials, components, positions of the components, and how the components are coupled to each other are illustrative only and not to be construed as limiting to the technology. Further, elements in the following example embodiments which are not recited in a most-generic independent claim of the technology are optional and may be provided on an as-needed basis. The drawings are schematic and are not intended to be drawn to scale. It is to be noted that the like elements are denoted with the same reference numerals, and any redundant description thereof will not be described in detail. It is to be noted that the description is given in the following order.

1. First Example Embodiment (A display unit provided with a first wiring layer underneath a gate electrode)
2. Modification Example 1 (An example in which an additional electrode is provided in the same layer as the first wiring layer)
3. Modification Example 2 (An example in which one electrode of a storage capacitor is provided in the same layer as the first wiring layer)
4. Second Example Embodiment (A display unit including an organic insulating film between a gate electrode and a source-drain electrode)
5. Modification Example 3 (An example in which an under-wiring insulating film is provided between a second wiring layer and the first wiring layer)
6. Application Example (Example of Electronic Apparatus)

First Example Embodiment

[Configuration]

FIG. 1 schematically illustrates an overall configuration of a display unit, i.e., a display unit 1 according to an embodiment of the disclosure. The display unit 1 may be, for example, an organic EL display using an organic electroluminescent element. The display unit 1 may be a top emission display unit which outputs, for example, light of any of R (red), G (green), and B (blue) from top face side. The display unit 1 may include a display region 1A in the middle and a peripheral region 1B outside the display region 1A. The display region 1A may have a quadrangular shape, for example. The peripheral region 1B may be provided in a bezel shape to surround the display region 1A.

Figure 2:
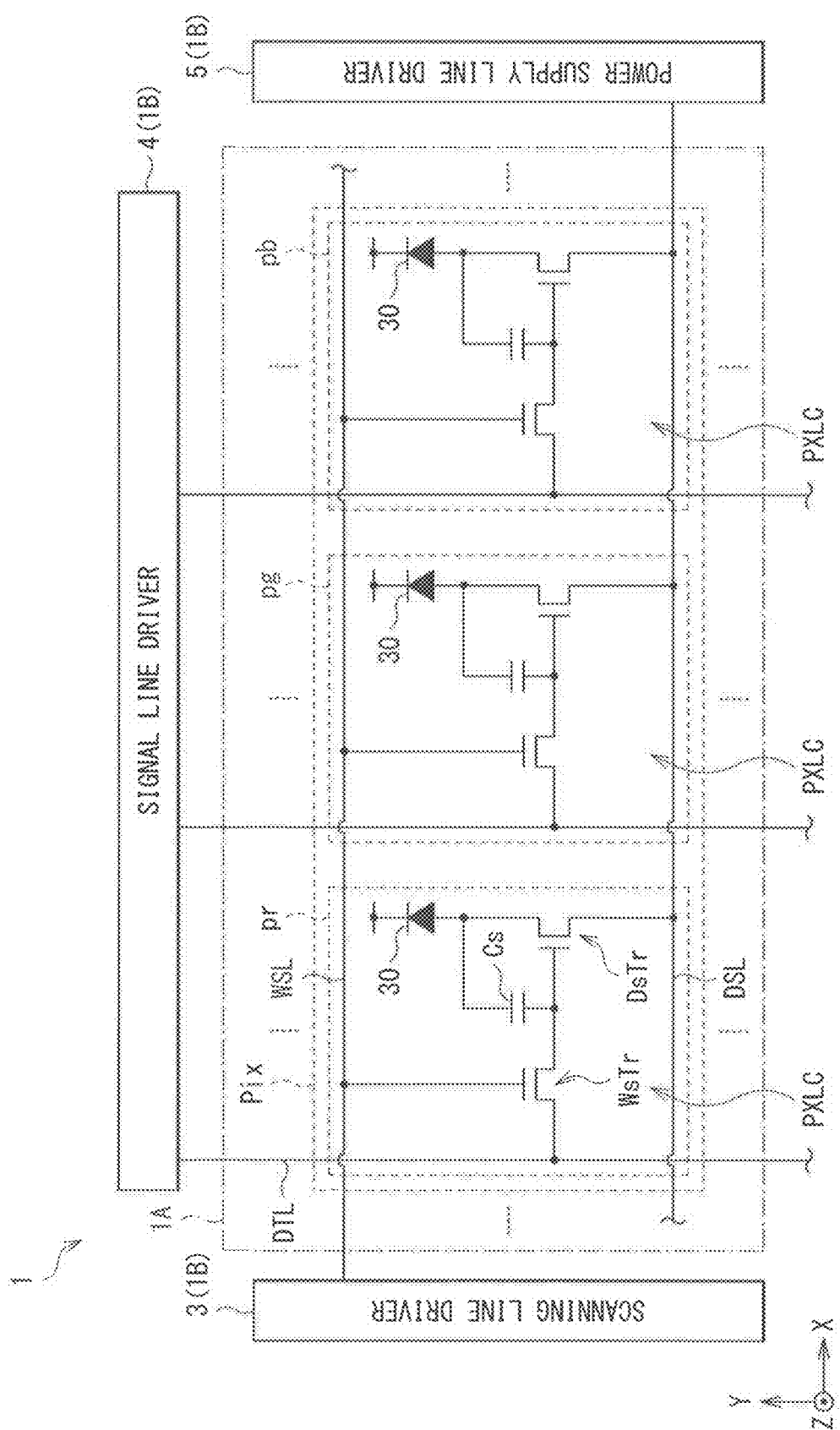
FIG. 2 is a block diagram illustrating an overall configuration of the display unit illustrated in FIG. 1.

FIG. 2 illustrates an example of a functional configuration of each of the display region 1A and the peripheral region 1B. The display region 1A includes a plurality of pixels pr, pg, and pb that are disposed two-dimensionally. The display region 1A may display an image, by means of an active matrix scheme, for example, on the basis of an image signal inputted from the outside. The peripheral region 1B may include a circuit section that drives the display region 1A, for example. The circuit section may include a scanning line driver 3, a signal line driver 4, and a power supply line driver 5. There may be provided, across from the display region 1A to the peripheral region 1B, a plurality of scanning lines WSL each extending in a row direction of pixel arrangement, a plurality of signal lines DTL each extending in a column direction, and a plurality of power supply lines DSL each extending in the row direction. Each of the pixels pr, pg, and pb may be coupled to the scanning line driver 3, the signal line driver 4, and the power supply line driver 5 via, respectively, the scanning line WSL, the signal line DTL, and the power supply line DSL. The pixels pr, pg, and pb may each correspond to a subpixel, for example. A set of the pixels pr, pg, and pb may configure one pixel, i.e., a pixel Pix.

Figure 3:
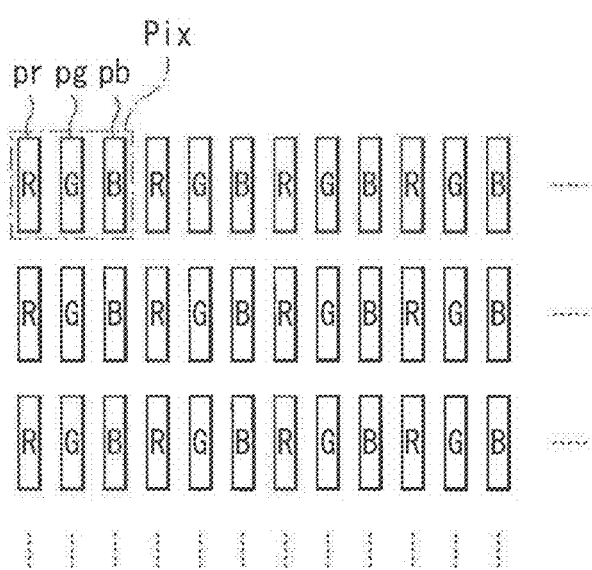
FIG. 3 is a schematic diagram illustrating arrangement of pixels illustrated in FIG. 2.

FIG. 3 illustrates an example of a planar configuration of the pixel Pix, i.e., the pixels pr, pg, and pb illustrated in FIG. 2. The pixels pr, pg, and pb may each have a surface in a rectangular shape, for example, and may be disposed in a stripe shape as a whole. Pixels of the same emission color may be disposed in a direction (i.e., a column direction in FIG. 3) along a long side of the rectangular shape of each of the pixels pr, pg, and pb. The pixel pr may display a red color (R), for example. The pixel pg may display a green color (G), for example. The pixel pb may display a blue color (B), for example. The pixels pr, pg, and pb may each include a pixel circuit PXLC that includes an organic EL element 30, as illustrated in FIG. 2.

Hereinafter, the pixels pr, pg, and pb are each referred to as a "pixel P" for description in a case where no distinction is necessary.

The pixel circuit PXLC may control light emission and light extinction in each of the pixels pr, pg, and pb. The pixel circuit PXLC may include the organic EL element, i.e., a display element, 30, a storage capacitor Cs, a switching transistor WsTr, and a driving transistor DsTr, for example. It is to be noted that, in this example, a circuit configuration of 2Tr1C is exemplified as the pixel circuit PXLC; however, the configuration of the pixel circuit PXLC is not limited thereto. The pixel circuit PXLC may have a circuit configuration in which components such as various capacitors and transistors are further added to the 2Tr1C circuit.

The switching transistor WsTr may control application of an image signal, i.e., a signal voltage to a gate electrode of the driving transistor DsTr. In a specific but non-limiting example, the switching transistor WsTr may sample a voltage, i.e. a signal voltage, of the signal line DTL in response to a voltage applied to the scanning line WSL, and may write the signal voltage into the gate electrode of the driving transistor DsTr. The driving transistor DsTr may be coupled in series to the organic EL element 30, and may control a current that flows to the organic EL element 30 in response to magnitude of the signal voltage sampled by the switching transistor WsTr. The driving transistor DsTr and the switching transistor WsTr may be each formed by an n-channel MOS or p-channel MOS thin film transistor (TFT), for example. The driving transistor DsTr and the switching transistor WsTr may be each a single-gate transistor or a dual-gate transistor. The storage capacitor Cs may hold a predetermined voltage between the gate electrode and a source electrode of the driving transistor DsTr.

The switching transistor WsTr has a gate electrode that may be coupled to the scanning line WSL. The switching transistor WsTr has a source electrode and a drain electrode; one electrode thereof may be coupled to the signal line DTL, and the other electrode thereof may be coupled to the gate electrode of the driving transistor DsTr. The driving transistor DsTr has the source electrode and a drain electrode; one electrode thereof may be coupled to the power supply line DSL, and the other electrode thereof may be coupled to an anode, i.e., a first electrode 31 described later of the organic EL element 30. The storage capacitor Cs may be provided between the gate electrode of the driving transistor DsTr and an electrode on side of the organic EL element 30.

The scanning line WSL may be provided to supply a selection pulse to each of the pixels P. The selection pulse may be used to select, on a row basis, a plurality of pixels P disposed in the display region 1A. The scanning line WSL may be coupled to an unillustrated output terminal of the scanning line driver 3 and to the gate electrode of the switching transistor WsTr described later. The signal line DTL may be provided to supply, to each of the pixels P, a signal pulse (i.e., a signal electric potential Vsig and a reference electric potential Vofs) in response to the image signal. The signal line DTL may be coupled to an unillustrated output terminal of the signal line driver 4 and to the source electrode or the drain electrode of the switching transistor WsTr described later. The power supply line DSL may be provided to supply, to each of the pixels P, a fixed electric potential (Vcc) as power. The power supply line DSL may be coupled to an unillustrated output terminal of the power supply line driver 5 and to the source electrode or the drain electrode of the driving transistor DsTr described later. It is to be noted that the organic EL element 30 has a cathode, i.e., a second electrode 34 described later that may be coupled to a common electric potential line, i.e., a cathode line.

The scanning line driver 3 may output a predetermined selection pulse to each of the scanning lines WSL line-sequentially to thereby cause each of the pixels P to execute each of operations such as anode reset, Vth compensation, writing of the signal electric potential Vsig, mobility compensation, and light emission operation, for example, at a predetermined timing. The signal line driver 4 may generate an analog image signal corresponding to the digital image signal inputted from the outside, and may output the generated analog image signal to each of the signal lines DTL. The power supply line driver 5 may output a fixed electric potential to each of the power supply lines DSL. The scanning line driver 3, the signal line driver 4, and the power supply line driver 5 may be controlled to operate in conjunction with one another, on the basis of a timing control signal outputted by an unillustrated timing controller. A digital image signal inputted from the outside may be subject to compensation by an unillustrated image signal receiver Thereafter, the resultant digital image signal may be inputted to the signal line driver 4.

Description is given below of a specific configuration of the display unit 1.

Figure 4:
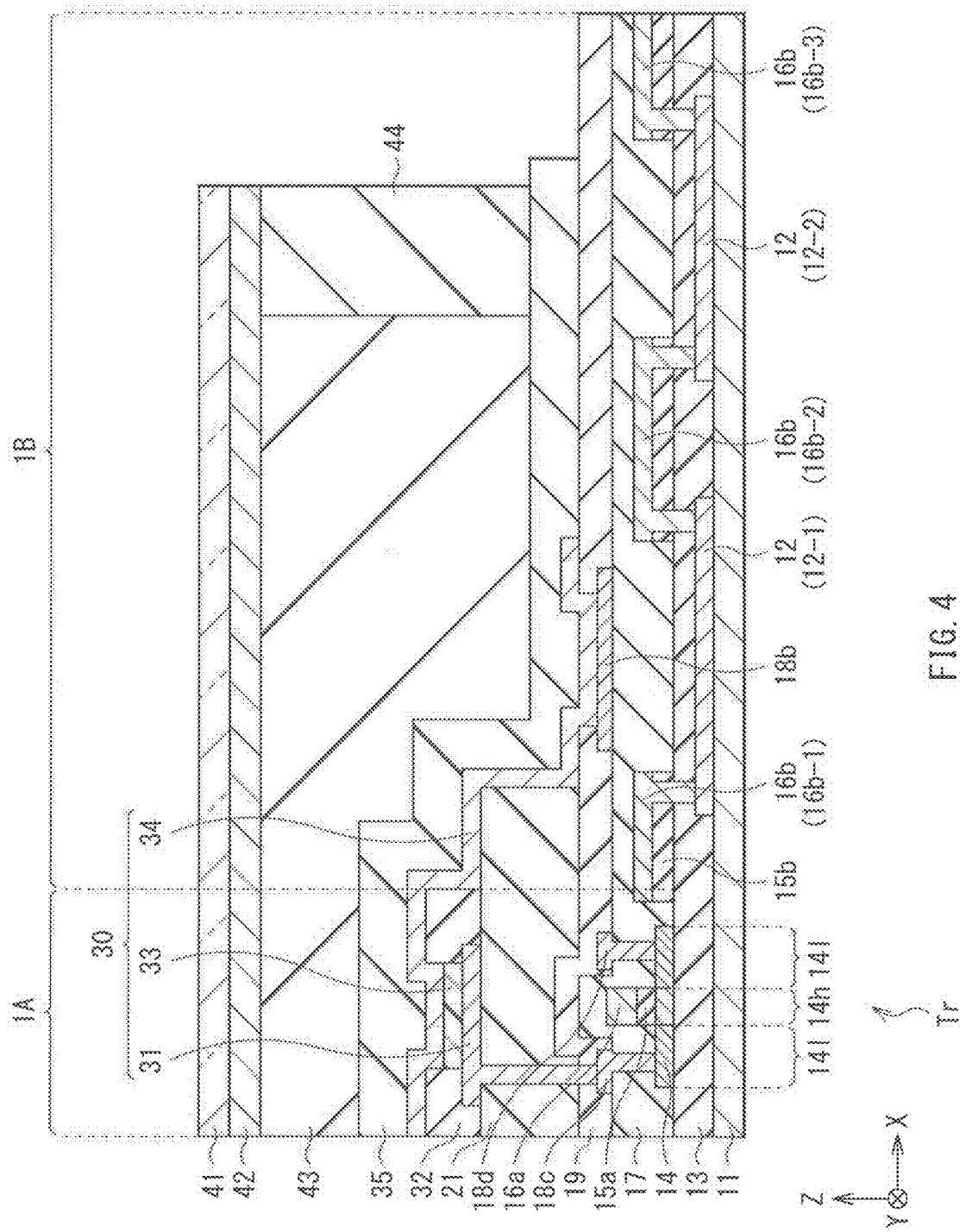
FIG. 4 is a schematic diagram illustrating a cross-sectional configuration of the display unit taken along line IV-IV' illustrated in FIG. 1.

FIG. 4 schematically illustrates a cross-sectional configuration of the display unit 1 from the display region 1A to the peripheral region 1B. FIG. 4 corresponds to a cross-sectional configuration taken along line IV-IV' illustrated in FIG. 1. In the display unit 1, a plurality of organic EL elements 30 may be sealed between a first substrate 11 and a second substrate 41 that face each other. A transistor Tr and the organic EL element 30 may be provided in the display region 1A on the first substrate 11.

The transistor Tr may be a top-gate thin film transistor, for example. The transistor Tr includes a semiconductor layer 14, a gate insulating film 15a, a gate electrode 16a, and source-drain electrodes 18c and 18d, in this order from a position close to the first substrate 11. A first inorganic insulating film 13, i.e., a first insulating film may be provided between the first substrate 11 and the semiconductor layer 14. A second inorganic insulating film 17, i.e., a second insulating film and a third inorganic insulating film 19 may be stacked on the first inorganic insulating film 13. The second inorganic insulating film 17 may cover the semiconductor layer 14, the gate insulating film 15a, the gate electrode 16a. The source-drain electrodes 18c and 18d of the transistor Tr may be provided on the second inorganic insulating film 17. The source-drain electrodes 18c and 18d may be covered with the third inorganic insulating film 19. The organic EL element 30 may be disposed on the third inorganic insulating film 19, with a planarizing layer 21 being interposed therebetween.

The organic EL element 30 may include, in order from a position close to the planarizing layer 21, the first electrode 31, an organic layer 33, and the second electrode 34. A first concave portion of the second electrode 34 contacts the organic layer 33. An element separation film 32 may be provided between adjacent organic EL elements 30. A protective film 35, for example, may be provided on the organic EL element 30. The second substrate 41 may be joined onto the protective film 35, with a filling layer 43 and a sealing section 44 being interposed therebetween. A color filter (CF) layer 42, for example, may be provided on a surface, of the second substrate 41, that faces the first substrate 11.

In the peripheral region 1B on the first substrate 11, there may be provided, in order from a position close to the first substrate 11, a first wiring layer 12, a connection wiring layer 16b, and a second wiring layer 18b. The first wiring layer 12 may be covered with the first inorganic insulating film 13. An under-wiring insulating film 15b may be provided between the first inorganic insulating film 13 and the connection wiring layer 16b. An elongated portion of the connection wiring layer 16b contacts the first inorganic insulating film 13 and the first wiring layer 12. The connection wiring layer 16b may be covered with the second inorganic insulating film 17. The second wiring layer 18b may be provided on the second inorganic insulating film 17.

The first substrate 11 may be made of, for example, a material such as glass, quartz, silicon, a resin material, and a metal plate. Non-limiting examples of the resin material may include polyethylene terephthalate (PET), polyimide (PI), polycarbonate (PC), and polyethylene naphthalate (PEN).

The first wiring layer 12 may be electrically coupled to the transistor Tr provided in the display region 1A via the connection wiring layer 16b. The first wiring layer 12 may be electrically coupled to one of the source-drain electrodes 18c and 18d, for example. The first wiring layer 12 may configure the power supply line DSL together with the connection wiring layer 16b. The first wiring layer 12 may be electrically coupled to the gate electrode 16a of the transistor Tr. In the present example embodiment, the first wiring layer 12 is disposed at a position closer to the first substrate 11 than a position in the same layer as the gate electrode 16a and the source-drain electrodes 18c and 18d of the transistor Tr. In other words, the first wiring layer 12 may be disposed underneath the gate electrode 16a and the source-drain electrodes 18c and 18d of the transistor Tr. As used herein, the position in the same layer as the gate electrode 16a and the source-drain electrodes 18c and 18d of the transistor Tr refers to a position of the wiring layer in a case where the wiring layer is formed in the same process as the gate electrode 16a and as the source-drain electrodes 18c and 18d. In this manner, the first wiring layer 12 may be formed in a process other than the process of formation of the gate electrode 16a and the source-drain electrodes 18c and 18d of the transistor Tr, although the detail is described later. Thus, it becomes possible to design factors such as a constituent material and a thickness of the first wiring layer 12, regardless of factors such as a constituent material and a thickness of the gate electrode 16a and the source-drain electrodes 18c and 18d.

The first wiring layer 12 covered with the first inorganic insulating film 13 may be disposed underneath the semiconductor layer 14 on the first inorganic insulating film 13. In other words, the first wiring layer 12 may be disposed at a position closer to the first substrate 11 than the semiconductor layer 14. The first wiring layer 12 may be disposed, for example, at two locations, i.e., at a region (i.e., a first wiring layer 12-1) that faces the second wiring layer 18b and at a region (i.e., a first wiring layer 12-2) that faces the sealing section 44 outside the first wiring layer 12-1. By providing the first wiring layer 12-1 at the region that faces the second wiring layer 18b with an electric potential that is different from that of the first wiring layer 12, it becomes possible to suppress occurrence of a short circuit between wiring lines, as described later. By providing the first wiring layer 12-2 at the position that faces the sealing section 44 where moisture ingress from the outside is likely to occur, it becomes possible to suppress the moisture ingress from the outside, as described later.

Figure 5:
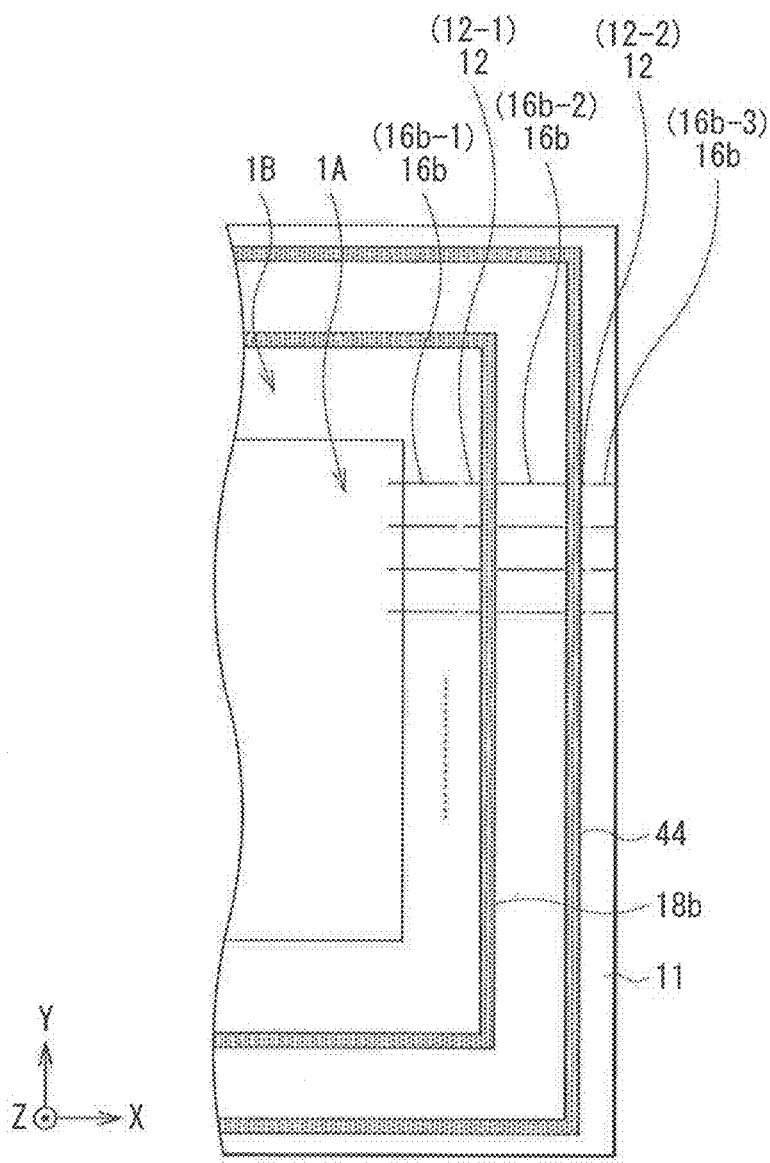
FIG. 5 is a schematic plan view of a configuration of components such as a first wiring line layer illustrated in FIG. 4.

FIG. 5 illustrates a planar (i.e., an X-Y plane) shape of each of the first wiring layer 12 and the connection wiring layer 16b, together with a planar shape of each of the second wiring layer 18b and the sealing section 44. The first wiring layer 12 and the connection wiring layer 16b may each extend in an X-axis direction, for example. The second wiring layer 18b and the sealing section 44 may each extend in a direction (i.e., a Y-axis direction) orthogonal to the extending direction (i.e., the X-axis direction) of the first wiring layer 12 and the connection wiring layer 16b, at a part overlapping the first wiring layer 12 and the connection wiring layer 16b. The connection wiring layer 16b may be provided at each of a part between a vicinity on the periphery of the display region 1A and the first wiring layer 12-1 and a part between the first wiring layer 12-1 and the first wiring layer 12-2. The connection wiring layer 16b may electrically couple the transistor Tr and the first wiring layer 12-1 to each other as well as the first wiring layer 12-1 and the first wiring layer 12-2 to each other. The connection wiring layer 16b electrically coupled to the first wiring layer 12-2 may also be disposed outside the first wiring layer 12-2.

In one embodiment, the first wiring layer 12 may have a thickness that is smaller than a thickness of the gate electrode 16a of the transistor Tr and a thickness of each of the source-drain electrodes 18c and 18d of the transistor Tr. By setting the thickness of the first wiring layer 12 smaller than the thickness of the gate electrode 16a of the transistor Tr and the thickness of each of the source-drain electrodes 18c and 18d of the transistor Tr, it becomes possible to suppress an end surface shape of the first wiring layer 12 from being collapsed. The first wiring layer 12 may have a thickness of about 50 nm to 200 nm.

Figure 6:
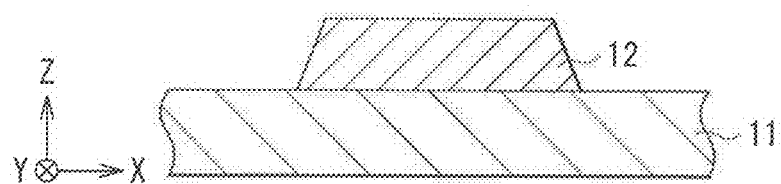
FIG. 6 is a schematic cross-sectional view of an example of a configuration of the first wiring line layer illustrated in FIG. 4.

FIG. 6 illustrates an example of a cross-sectional configuration of the first wiring layer 12. In one embodiment, an end surface of the first wiring layer 12 may have a shape that becomes wider as it comes closer to the first substrate 11. In other words, the end surface of the first wiring layer 12 may have a forward tapered shape. The taper angle may be 20°, for example. In one embodiment, a constituent material of the first wiring layer 12 may be a material that allows for easy formation of the forward tapered shape. Specific but non-limiting examples of the constituent material of the first wiring layer 12 may include molybdenum (Mo), titanium (Ti), tungsten (W), and copper (Cu). The first wiring layer 12 may be configured by a single-layer film of the materials such as molybdenum (Mo), titanium (Ti), tungsten (W), and copper (Cu). In an alternative embodiment, the first wiring layer 12 may be configured by an alloy or stacked film including any of the materials.

The first inorganic insulating film 13 that covers the first wiring layer 12 may be provided across the entire surface of each of the display region 1A and the peripheral region 1B on the first substrate 11. The first inorganic insulating film 13 may be configured by a single-layer film made of one of silicon oxide ($SiO_x$), silicon nitride ($SiN_x$), silicon oxynitride (SiON), and aluminum oxide ($AlO_x$), for example. In an alternative embodiment, the first inorganic insulating film 13 may be configured by a stacked film made of two or more thereof.

The first inorganic insulating film 13 may be configured by, for example, a stacked film including a silicon nitride film having a thickness of 50 nm and a silicon oxide film having a thickness of 100 nm, in order from a position close to the first substrate 11. The silicon nitride generally has high coatability. It becomes possible for the stacked film to improve a step coverage property of the first wiring layer 12 owing to use of the silicon nitride. Thus, a crack, for example, is less likely to occur in the first inorganic insulating film 13, making it possible to suppress a reduction in yield and reliability caused by the crack in the first inorganic insulating film 13. In addition, when an oxide semiconductor material is used for the semiconductor layer 14, it becomes possible for silicon nitride containing hydrogen to terminate a defect in the semiconductor layer 14. Hence, it becomes possible to improve reliability of the transistor Tr.

The transistor Tr corresponds to, for example, the driving transistor DsTr illustrated in FIG. 2, and is provided in the display region 1A.

The semiconductor layer 14 may be patterned on the first substrate 11. The semiconductor layer 14 may include a channel region 14h that faces the gate electrode 16a and a low-resistance region 141 outside the channel region 14h. The low-resistance region 141 may have an electric resistance that is smaller than an electric resistance of the channel region 14h. The low-resistance region 141 may serve as a source-drain region. The semiconductor layer 14 may be configured by an oxide semiconductor that includes, as a main component, an oxide of one or more elements of, for example, indium (In), gallium (Ga), zinc (Zn), tin (Sn), titanium (Ti), and niobium (Nb). Specific but non-limiting examples of the oxide semiconductor may include indium-tin-zinc oxide (ITZO), indium-gallium-zinc oxide (IGZO: InGaZnO), zinc oxide (ZnO), indium-zinc oxide (IZO), indium-gallium oxide (IGO), indium-tin oxide (ITO), and indium oxide (InO). In an alternative embodiment, the semiconductor layer 14 may be made of a material such as low-temperature polycrystalline silicon (LTPS) and amorphous silicon (a-Si).

The gate insulating film 15a provided between the semiconductor layer 14 and the gate electrode 16a may have the same planar shape as the gate electrode 16a, for example. The gate insulating film 15a has an end surface that may be disposed at a position overlapping an end surface of the gate electrode 16a in a plan view. That is, the transistor Tr may be a TFT having a self-aligning structure. The gate insulating film 15a may be configured by a single-layer film made of one of silicon oxide ($SiO_x$), silicon nitride ($SiN_x$), silicon oxynitride (SiON), and aluminum oxide ($AlO_x$), for example. In an alternative embodiment, the gate insulating film 15a may be configured by a stacked film made of two or more thereof.

The gate electrode 16a may face the semiconductor layer 14, with the gate insulating film 15a being interposed therebetween. The gate electrode 16a may control a carrier density in the semiconductor layer 14 by means of application of a gate voltage (Vg), and may serve as a wiring line that supplies an electric potential. Non-limiting examples of a constituent material of the gate electrode 16a may include a simple substance of one of titanium (Ti), tungsten (W), tantalum (Ta), aluminum (Al), molybdenum (Mo), silver (Ag), neodymium (Nd), and copper (Cu), and an alloy of any combination thereof. In an alternative embodiment, the gate electrode 16a may be a compound including one or more of the above-mentioned materials, or a stacked film including two or more thereof. Further, for example, a transparent electrically conductive film made of a material such as ITO may also be used.

The under-wiring insulating film 15b and the connection wiring layer 16b may be provided, for example, in the same layer as the gate insulating film 15a and the gate electrode 16a, respectively. That is, the under-wiring insulating film 15b and the connection wiring layer 16b may be formed in the same process as the gate insulating film 15a and as the gate electrode 16a, respectively. The under-wiring insulating film 15b and the gate insulating film 15a may be each made of the same constituent material, and may have substantially the same thickness. The connection wiring layer 16b and the gate electrode 16a may be each made of the same constituent material, and may have substantially the same thickness. The under-wiring insulating film 15b and the connection wiring layer 16b may have the same planar shape. The under-wiring insulating film 15b has an end surface that may be disposed at a position overlapping an end surface of the connection wiring layer 16b in a plan view.

The connection wiring layer 16b may be provided at a position not overlapping the second wiring layer 18b and the sealing section 44 in a plan view (i.e., the X-Y plane). In a specific but non-limiting example, the connection wiring layer 16b may be provided (as the connection wiring layer 16b-1) in a region from the vicinity on the periphery of the display region 1A to an end of the inside (i.e., side of the display region 1A) of the second wiring layer 18b. The connection wiring layer 16b may be provided (as the connection wiring layer 16b-2) in a region from an end of the outside of second wiring layer 18b to an end of the inside of the sealing section 44. The connection wiring layer 16b may be provided (as the connection wiring layer 16b-3) in a region outer than an end of the outside of the sealing section 44. The connection wiring layer 16b-1 may couple the transistor Tr and the first wiring layer 12-1 to each other. The connection wiring layer 16b-2 may couple the first wiring layer 12-1 and the first wiring layer 12-2 to each other. The connection wiring layer 16b-3 may couple the first wiring layer 12-2 and the power supply line driver 5, for example, to each other. The connection wiring layers 16b-1, 16b-2, and 16b-3 may be each coupled to the first wiring layers 12-1 and 12-2 via contact holes provided in the under-wiring insulating film 15b and the first inorganic insulating film 13.

The second inorganic insulating film 17 may cover, in addition to the gate electrode 16a, the gate insulating film 15a, and the semiconductor layer 14, the connection wiring layer 16b and the under-wiring insulating film 15b. The second inorganic insulating film 17 may be provided across from the display region 1A to the peripheral region 1B. The second inorganic insulating film 17 may be configured by, for example, a film such as a silicon oxide ($SiO_2$) film, a titanium oxide ($TiO_2$) film, and an aluminum oxide ($AlO_x$) film. The second inorganic insulating film 17 may be configured by a single-layer film of the above-mentioned films. In an alternative embodiment, the second inorganic insulating film 17 may be configured by a stacked film including a plurality of films. For example, the second inorganic insulating film 17 may be configured by a stacked film, and may include, in order from a position close to the first substrate 11, an aluminum oxide film having a thickness of 10 nm, a silicon oxide film having a thickness of 200 nm, and an aluminum oxide film having a thickness of 50 nm. The aluminum oxide film as an underlayer of such a second inorganic insulating film 17 may be in contact with the low-resistance region 141 of the semiconductor layer 14, thus allowing the low-resistance region 141 to be stabilized. Further, the aluminum oxide film as the upper layer may serve as a protective film having a favorable barrier property against the outside air, thus suppressing variation in electric characteristics of the semiconductor layer 14 caused by factors such as oxygen and moisture.

The source-drain electrodes 18c and 18d each provided on the second inorganic insulating film 17 may be electrically coupled to the low-resistance region 141 of the semiconductor layer 14 via contact holes provided in the second inorganic insulating film 17. The source-drain electrodes 18c and 18d may each serve as a source or a drain of the transistor Tr, and may include, for example, a transparent electrically conductive film or metal similar to those recited as the constituent material of the above-described gate electrode 16a. One (i.e., the source-drain electrode 18c) of a pair of the source-drain electrodes 18c and 18d may be electrically coupled to the first electrode 31 of the organic EL element 30 via a contact hole provided in the planarizing layer 21 and the third inorganic insulating film 19, for example.

The second wiring layer 18b provided in the peripheral region 1B may be provided in a quadrangular bezel shape, for example, to surround the display region 1A in a plan view, as illustrated in FIG. 5. The second wiring layer 18b may face the first wiring layer 12-1, with the second inorganic insulating film 17 and the first inorganic insulating film 13 being interposed therebetween. In other words, the second wiring layer 18b may be provided on the first substrate 11, with the first wiring layer 12-1 being interposed therebetween. The second wiring layer 18b may be provided in the same layer as the source-drain electrodes 18c and 18d, for example. That is, the second wiring layer 18b may be formed in the same process as the source-drain electrodes 18c and 18d, and may be made of the same constituent material as that of the source-drain electrodes 18c and 18d. The second wiring layer 18b may have a thickness substantially the same as the thickness of the source-drain electrodes 18c and 18d. The second wiring layer 18b may be electrically coupled to a second concave portion of the second electrode 34 of the organic EL element 30, for example, and may have an electric potential different from that of the first wiring layer 12-1.

An unillustrated etching protective film may be stacked on the second wiring layer 18b. The etching protective film may be provided to suppress or prevent damage of the second wiring layer 18b caused by etching upon formation of the first electrode 31. The etching protective film may be made of a metal material, for example.

The third inorganic insulating film 19 on the second inorganic insulating film 17 may be provided across the display region 1A and the peripheral region 1B. The third inorganic insulating film 19 may cover the source-drain electrodes 18c and 18d and the second wiring layer 18b. Respective contact holes reaching the source-drain electrode 18c and the second wiring layer 18b are provided in the third inorganic insulating film 19. The source-drain electrode 18c and the second wiring layer 18b may be electrically coupled, respectively, to the first electrode 31 of the organic EL element 30 and the second electrode 34 of the organic EL element 30 via these contact holes. The third inorganic insulating film 19 may be configured by, for example, a film such as a silicon oxide ($SiO_2$) film, a titanium oxide ($TiO_2$) film, and an aluminum oxide ($AlO_x$) film. The third inorganic insulating film 19 may be configured by a single-layer film of the above-mentioned films. In an alternative embodiment, the third inorganic insulating film 19 may be configured by a stacked film including a plurality of films. For example, the third inorganic insulating film 19 may be configured by a silicon oxide film having a thickness of 300 nm. The planarizing layer 21 may be provided in place of the third inorganic insulating film 19 on the second inorganic insulating film 17.

The planarizing layer 21 on the third inorganic insulating film 19 may extend from the display region 1A to a part of the peripheral region 1B. The planarizing layer 21 has an end surface that may be disposed inside the second wiring layer 18b. In other words, the second wiring layer 18b may not be covered with the planarizing layer 21. The planarizing layer 21 may have the contact hole reaching the source-drain electrode 18c provided in the third inorganic insulating film 19. The first electrode 31 of the organic EL element 30 may be electrically coupled to the source-drain electrode 18c via the contact hole provided in the planarizing layer 21 and the third inorganic insulating film 19. The planarizing layer 21 may be made of, for example, an organic insulating material having photosensitivity such as a polyimide resin, a novolak resin, an epoxy resin, and an acrylic resin.

The organic EL element 30 may be provided in the display region 1A on the planarizing layer 21 for each of the pixels pr, pg, and pb. A plurality of first electrodes 31 of the organic EL element 30 may be disposed on the planarizing layer 21. The plurality of first electrodes 31 may be so provided as to be separated from one another.

Each of the first electrode 31 may be a reflective electrode that serves as an anode, for example, and may be provided for each of the pixels P. Non-limiting examples of a constituent material of the first electrode 31 may include a simple substance and an alloy of a metal element such as aluminum (Al), neodymium (Nd), chromium (Cr), gold (Au), platinum (Pt), nickel (Ni), tungsten, and silver (Ag). Further, the first electrode 31 may include a stacked film of a metal film and an electrically conductive material, i.e., a transparent electrically conductive film. The metal film may be made of a simple substance or an alloy of the above-mentioned metal elements. The transparent electrically conductive film may have light-transmissivity. Non-limiting examples of the transparent electrically conductive film may include indium-tin oxide (ITO), indium-zinc oxide (IZO), and a zinc oxide (ZnO)-based material. Non-limiting examples of the zinc oxide-based material may include aluminum (Al)-doped zinc oxide (AZO) and gallium-doped zinc oxide (GZO).

The element separation film 32 may cover the plurality of first electrodes 31, and may be provided across from a surface of each first electrode 31 to a surface of an adjacent first electrode 31. The element separation film 32 may have an opening that faces each first electrode 31. The first electrode 31 may be exposed from the element separation film 32 in the opening, and the organic layer 33 may be disposed on the exposed first electrode 31. The element separation film 32 may be provided to define a light-emission region of each of the pixels P and to ensure an insulating property between the first electrode 31 and the second electrode 34. The element separation film 32 may serve as a so-called partition wall in a case where the organic layer 33 is formed by means of a wet process. The element separation film 32 may include, for example, a photosensitive resin such as an acrylic resin, a polyimide resin, a fluorine resin, a silicon resin, a fluorine polymer, a silicon polymer, a novolak resin, an epoxy resin, and a norbornene resin. In an alternative embodiment, any of these resin materials with a pigment dispersed therein may also be used. Further, for example, an inorganic material such as silicon oxide, silicon nitride, and silicon oxynitride may also be used for the element separation film 32.

Figure 7:
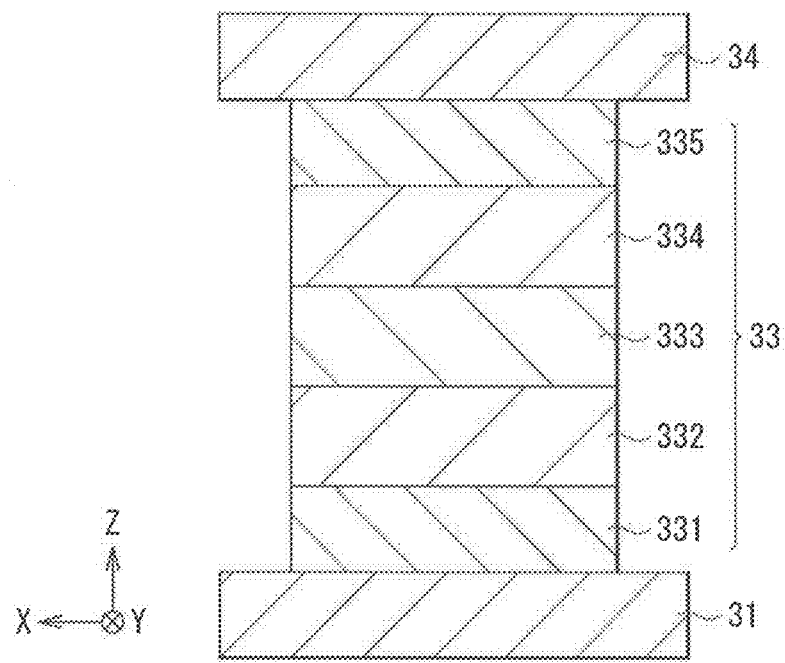
FIG. 7 is a schematic cross-sectional view of an example of a configuration of an organic layer illustrated in FIG. 4.

FIG. 7 illustrates an example of a specific configuration of the organic layer 33. The organic layer 33 may include, for example, a hole injection layer 331, a hole transport layer 332, a light emission layer 333, an electron transport layer 334, and an electron injection layer 335, in this order from a position close to the first electrode 31. The organic layer 33 may be provided, for example, in the opening of the element separation film 32 for each of the pixels pr, pg, and pb. The light emission layers 333 of the respective pixels pr, pg, and pb may have different colors. For example, the light emission layer 333 of the pixel pr, the light emission layer 333 of the pixel pg, and the light emission layer 333 of the pixel pb generate a red color, a green color, and a blue color, respectively.

The hole injection layer 331 may suppress or prevent leakage, and may be made of hexaazatriphenylene (HAT), for example. The hole injection layer 331 may have a thickness of 1 nm to 20 nm, for example. The hole transport layer 332 may be made of, for example, α-NPD[N,N'-di(1-naphthyl)-N,N'-diphenyl-[1,1'-biphenyl]-4,4'-diamine]. The hole transport layer 332 may have a thickness of 15 nm to 100 nm, for example.

The light emission layer 333 may be configured to emit light of a predetermined color by means of coupling between holes and electrons. The light emission layer 333 may have a thickness of 5 nm to 50 nm, for example. The light emission layer 333 that emits light in a red wavelength region may be made of rubrene doped with a pyrromethene-boron complex, for example. In this situation, rubrene may be used as a host material. The light emission layer 333 that emits light in a green wavelength region may be made of $Alq^3$(trisquinolinol-aluminum complex), for example. The light emission layer 333 that emits light in a blue wavelength region may be made of ADN(9,10-di(2-naphthyl)anthracene) doped with a diaminochrysene derivative, for example. In this situation, ADN is vapor-deposited as a host material having a thickness of 20 nm, for example, on the hole transport layer 332. The diaminochrysene derivative is doped as a dopant material at a relative film thickness ratio of 5%.

The electron transport layer 334 may be made of BCP(2, 9-dimethyl-4,7-diphenyl-1,10-phenanthroline. The electron transport layer 334 may have a thickness of 15 nm to 200 nm, for example. The electron injection layer 335 may be made of lithium fluoride (LiF), for example. The electron injection layer 335 may have a thickness of 15 nm to 270 nm, for example.

The second electrode 34 that faces the first electrode 31 with the organic layer 33 being interposed therebetween may serve as a cathode, for example. The second electrode 34 may be formed across the entire surface of the display region 1A. In other words, the second electrode 34 may be formed as an electrode common to all of the pixels P. The second electrode 34 may extend on the third inorganic insulating film 19 of the peripheral region 1B via the end surface of the planarizing layer 21, for example, and may be electrically coupled to the second wiring layer 18b via the contact hole provided in the third inorganic insulating film 19. The second electrode 34 may be configured by a transparent electrically conductive film, for example. Non-limiting examples of the transparent electrically conductive film may include indium-tin oxide (ITO), indium-zinc oxide (IZO), and a zinc oxide (ZnO)-based material. Non-limiting examples of the zinc oxide-based material may include aluminum (Al)-doped zinc oxide (AZO) and gallium-doped zinc oxide (GZO). Although a thickness of the second electrode 34 is not particularly limited, the thickness may be set in consideration of electrical conductivity and light-transmissivity. Aside from these materials, an alloy of magnesium and silver (an Mg—Ag alloy) may also be used for the second electrode 34.

The protective film 35 may be provided to cover the second electrode 34, and may extend across the entire surfaces of the display region 1A and the peripheral region 1B. The protective film 35 may serve as a protective film that suppresses or prevents moisture ingress into the organic EL element 30 and suppresses or prevents variation in characteristics such as light emission efficiency. The protective film 35 may be made of silicon nitride having a thickness of about 3 μm, for example.

The filling layer 43 may join the protective film 35 and the second substrate 41 together, and may seal the organic EL element 30. The filing layer 43 may be provided across the entire surface of the protective film 35. Non-limiting examples of a material of the filling layer 43 may include an acrylic resin, a polyimide resin, a fluorine resin, a silicon resin, a fluorine polymer, a silicon polymer, a novolak resin, an epoxy resin, and a norbornene resin. In an alternative embodiment, any of these resin materials with a pigment dispersed may also be used.

The sealing section 44 may be provided in the peripheral region 1B outside the filling layer 43. The sealing section 44 may be provided in a bezel shape to surround the display region 1A as illustrated in FIG. 5, and may be disposed on the periphery of the second substrate 41. The sealing section 44 may seal, between the first substrate 11 and the second substrate 41, the components provided therebetween, together with the organic EL element 30. The sealing section 44 may be made of, for example, a resin material such as an epoxy resin and an acrylic resin.

A color filter layer 42 may include a red filter, a green filter, and a blue filter, for example. The color filter layer 42 may be provided, for example, on the entire surface of the second substrate 41. For example, the color filter layer 42 may be provided on a surface on side of the filling layer 43. The red filter, the green filter, and the blue filter may be provided in regions facing the organic EL elements 30 for the pixels pr, pg, and pb, respectively. These red filters, green filters, and blue filters may be each made of a resin with a pigment mixed therein.

A black matrix layer may also be provided in a region between the above-described red filter, green filter, and blue filter, i.e., in a region between pixels. The black matrix layer may be configured, for example, by a resin film with a black colorant mixed therein, or by a thin film filter utilizing interference of a thin film. The thin film filter may have a configuration in which, for example, one or more thin films made of a material such as metal, a metal nitride, and a metal oxide are stacked to attenuate light by utilizing the interference of a thin film. Specific but non-limiting examples of the thin film filter may include a filter in which chromium (Cr) and chromium(III) oxide ($Cr_2O_3$) are stacked alternately.

The second substrate 41, together with the filling layer 43, may seal the organic EL element 30. The second substrate 41 may be made of, for example, a material such as glass or plastic that is transparent to light generated in the organic EL element 30.

[Manufacturing Method]

Such a display unit 1 may be manufactured, for example, as described below, as illustrated in FIGS. 8A to 10B.

Figure 8A:
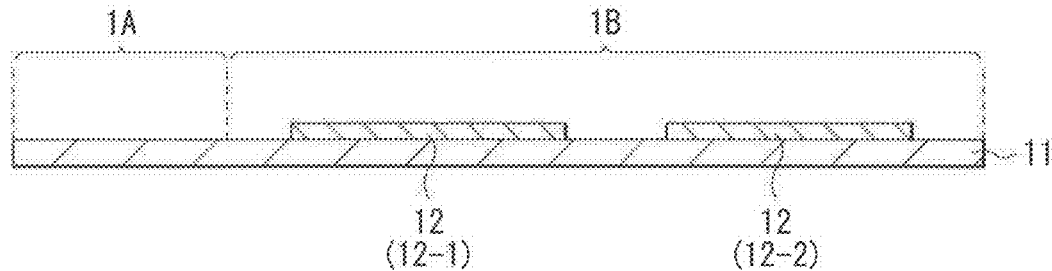
FIG. 8A is a schematic cross-sectional view of one process of a method of manufacturing the display unit illustrated in FIG. 4.

Molybdenum (Mo) may be first formed, on the first substrate 11, into a film having a thickness of 100 nm by means of a sputtering method, for example. Thereafter, patterning may be performed on the film by means of a photolithography method and a dry etching method. This allows for formation of the first wiring layers 12-1 and 12-2 as illustrated in FIG. 8A. The dry etching method may involve using a carbon tetrafluoride ($CF_4$)-oxygen ($O_2$) gas, for example.

Figure 8B:
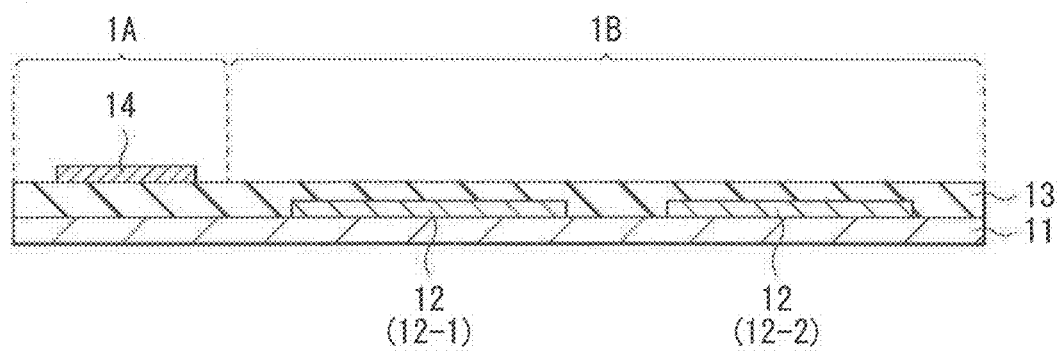
FIG. 8B is a schematic cross-sectional view of a process subsequent to FIG. 8A.

Next, the first inorganic insulating film 13 and the semiconductor layer 14 may be formed in this order, as illustrated in FIG. 8B. The first inorganic insulating film 13 may be formed, for example, by forming a silicon nitride ($SiN_x$) film having a thickness of 50 nm and a silicon oxide ($SiO_2$) film having a thickness of 100 nm in this order by means of a chemical vapor deposition (CVD) method. A silane ($SiH_4$) gas may be used as a process gas, for example, upon forming the silicon nitride film. The semiconductor layer 14 may be formed, for example, by forming an oxide semiconductor material into a film having a thickness of 30 nm by means of a sputtering method and thereafter performing patterning of the film by means of a photolithography method.

Figure 8C:
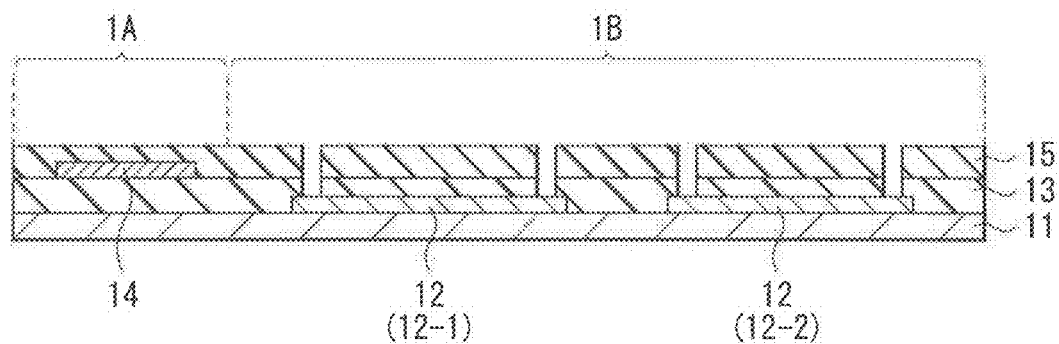
FIG. 8C is a schematic cross-sectional view of a process subsequent to FIG. 8B.
Figure 9A:
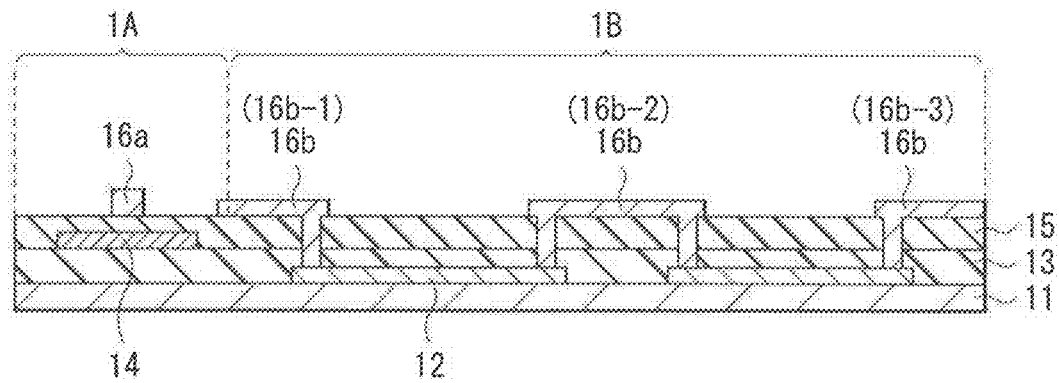
FIG. 9A is a schematic cross-sectional view of a process subsequent to FIG. 8C.
Figure 9B:
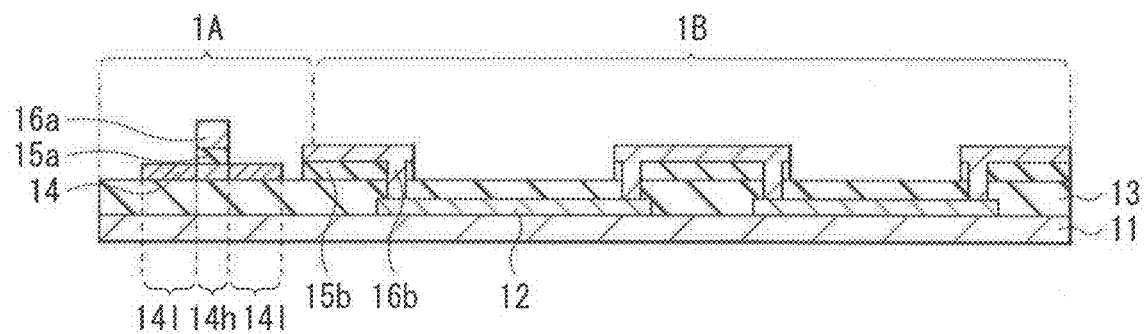
FIG. 9B is a schematic cross-sectional view of a process subsequent to FIG. 9A.

The formation of the semiconductor layer 14 may be followed by formation of the gate insulating film 15a, the under-wiring insulating film 15B, the gate electrode 16a, and the connection wiring layer 16b, as illustrated in FIGS. 8C, 9A, and 9B. In a specific but non-limiting example, the process may be performed as follows.

An insulating film 15 may be first formed on the first inorganic insulating film 13 to cover the semiconductor layer 14, and thereafter contact holes reaching the first wiring layers 12-1 and 12-2 may be formed in the insulating film 15, as illustrated in FIG. 8C. The insulating film 15 may be provided to form the gate insulating film 15a and the under-wiring insulating film 15b. The insulating film 15 may be formed, for example, by forming a silicon oxide ($SiO_2$) film having a thickness of 200 nm by means of a CVD method. The contact holes in the insulating film 15 may be formed by means of a photolithography method and a dry etching method, for example. The dry etching method may involve using a carbon tetrafluoride ($CF_4$) gas, for example.

The formation of the contact holes in the insulating film 15 may be followed by formation of the gate electrode 16a and the connection wiring layers 16b, i.e., the connection wiring layers 16b-1, 16b-2, and 16b-3 on the insulating film 15 in the same process, as illustrated in 9A. In a specific but non-limiting example, a titanium (Ti) film having a thickness of 50 nm, an aluminum (Al) film having a thickness of 500 nm, and a titanium (Ti) film having a thickness of 50 nm may be formed in this order on the insulating film 15 by means of a sputtering method. Thereafter, patterning may be performed on the films by means of a photolithography method and a dry etching method. The dry etching method may involve using a chloride ($Cl_2$) gas, for example. This allows for formation of the gate electrode 16a and the connection wiring layers 16b, i.e., 16b-1, 16b-2, and 16b-3. The gate electrode 16a may be disposed at a position facing the semiconductor layer 14. The connection wiring layers 16b may be coupled to the first wiring layer 12 via respective contact holes provided in the insulating film 15.

Following the etching process upon formation of the gate electrode 16a and the connection wiring layers 16b, the insulating film 15 may be etched subsequently to form the gate insulating film 15a and the under-wiring insulating film 15b in the same process, as illustrated in FIG. 9B. In this situation, the gate electrode 16a and the connection wiring layer 16b may each serve as a mask to form the gate insulating film 15a and the under-wiring insulating film 15b. The gate insulating film 15a and the under-wiring insulating film 15b may have the same planar shapes as those of the gate electrode 16a and the connection wiring layer 16b, respectively. The etching of the insulating film 15 may involve employing a dry etching method using a carbon tetrafluoride ($CF_4$) gas, for example. Upon the etching of the insulating film 15, the semiconductor layer 14 exposed from the gate electrode 16a may be caused to have a lower resistance, and the channel region 14h and the low-resistance region 141 may be formed in a self-aligned manner.

Figure 9C:
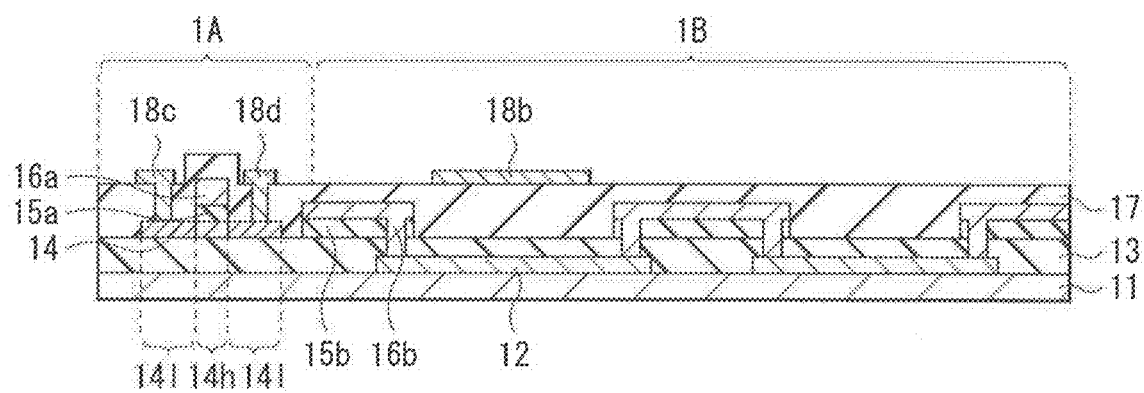
FIG. 9C is a schematic cross-sectional view of a process subsequent to FIG. 9B.

The formation of the gate insulating film 15a and the under-wiring insulating film 15b may be followed by formation of the second inorganic insulating film 17 and by formation of the source-drain electrodes 18c and 18d and the second wiring layer 18b that are provided on the second inorganic insulating film 17, as illustrated in FIG. 9C. In a specific but non-limiting example, the process may be performed as follows.

The second inorganic insulating film 17 may be first formed to cover the gate electrode 16a and the connection wiring layers 16b. The second inorganic insulating film 17 may be formed, for example, by forming an aluminum oxide ($AlO_2$) film having a thickness of 10 nm, a silicon oxide (SiO) film having a thickness of 200 nm, and an aluminum oxide ($AlO_2$) film having a thickness of 50 nm in this order on the first inorganic insulating film 13 by means of a sputtering method. The contact holes reaching respective low-resistance regions 141 of the semiconductor layer 14 may be formed in the second inorganic insulating film 17 by means of a photolithography method and a dry etching method. In this example, for example, etching of aluminum oxide, silicon oxide, and aluminum oxide may be performed, sequentially in order from the upper layer, using, respectively, a chlorine ($Cl_2$) gas, a carbon tetrafluoride ($CF_4$) gas, and a chlorine ($Cl_2$) gas.

The formation of the contact holes in the second inorganic insulating film 17 may be followed by formation of the source-drain electrodes 18c and 18d and the second wiring layer 18b in the same process. The source-drain electrodes 18c and 18d and the second wiring layer 18b may be each formed, for example, as follows. A titanium (Ti) film having a thickness of 50 nm, an aluminum (Al) film having a thickness of 500 nm, and a titanium (Ti) film having a thickness of 50 nm may be formed in this order on the second inorganic insulating film 17 by means of a sputtering method. Thereafter, patterning of the films may be performed by means of a photolithography method and a dry etching method to form the source-drain electrodes 18c and 18d and the second wiring layer 18b. The dry etching method may involve using a chlorine ($Cl_2$) gas, for example. The source-drain electrodes 18c and 18d may be electrically coupled to the respective low-resistance regions 141 of the semiconductor layer 14 via the contact holes provided in the second inorganic insulating film 17.

Figure 10A:
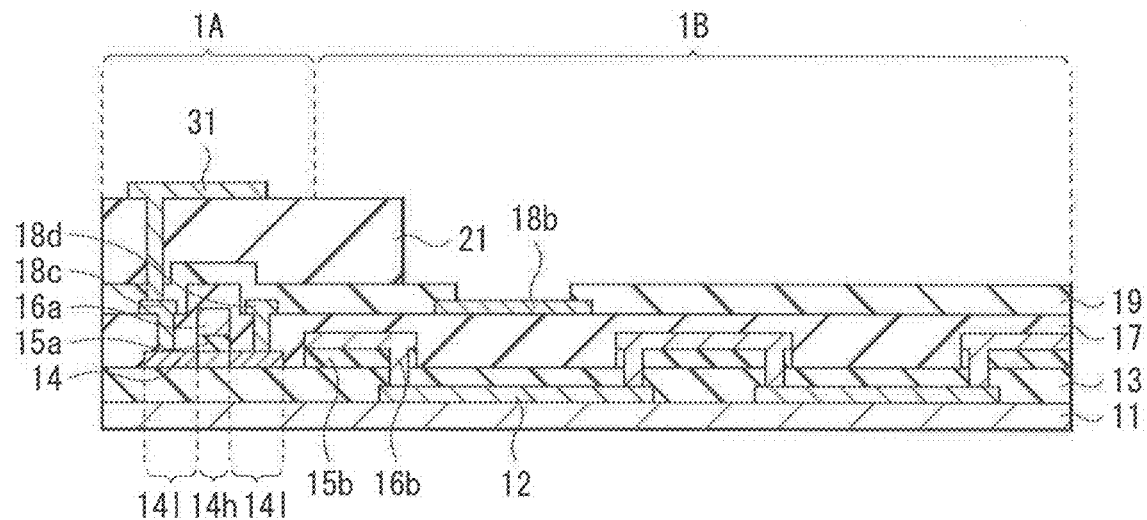
FIG. 10A is a schematic cross-sectional view of a process subsequent to FIG. 9C.

The formation of the source-drain electrodes 18c and 18d and the second wiring layer 18b may be followed by formation of the third inorganic insulating film 19, the planarizing layer 21, and the first electrode 31 in this order, as illustrated in FIG. 10A.

The third inorganic insulating film 19 may be formed, for example, by forming a silicon oxide ($SiO_2$) film having a thickness of 300 nm by means of a CVD method. The contact holes reaching the source-drain electrodes 18c and 18d and the second wiring layer 18b may be formed in the third inorganic insulating film 19 by means of a photolithography method and a dry etching method. The dry etching may involve using a carbon tetrafluoride ($CF_4$) gas, for example.

The planarizing layer 21 may be formed, for example, by forming, as a film, polyimide having photosensitivity on the third inorganic insulating film 19 and thereafter performing patterning of the polyimide film into a predetermined shape by means of a photolithography method. The contact hole reaching the source-drain electrodes 18c and 18d via the contact holes formed in the third inorganic insulating film 19 may be formed in the planarizing layer 21.

The first electrode 31 may be formed by forming, as a film, aluminum-neodymium (AlNd) having a thickness of 250 nm by a sputtering method to fill the contact hole formed in the planarizing layer 21 and thereafter performing patterning by means of a photolithography method and an etching method. The etching method may involve employing a wet etching method using a phosphoric acid-nitric acid-acetic acid etchant, for example.

Figure 10B:
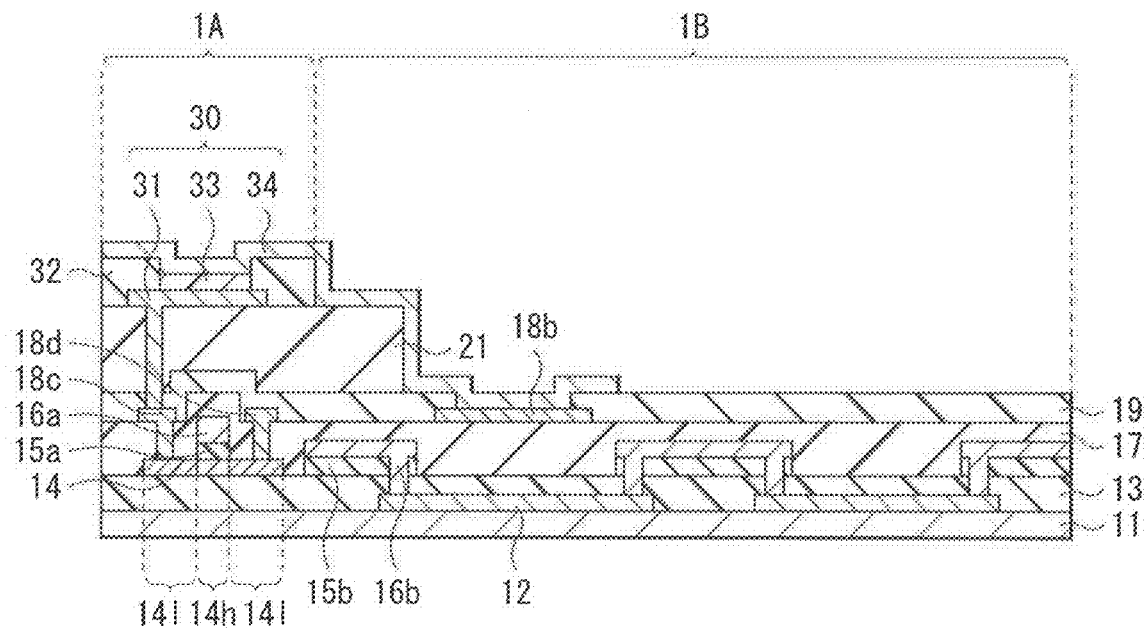
FIG. 10B is a schematic cross-sectional view of a process subsequent to FIG. 10A.

The formation of the first electrode 31 may be followed by formation of the element separation film 32, the organic layer 33, and the second electrode 34 in this order, as illustrated in FIG. 10B. The element separation film 32 may be formed, for example, by forming, as a film, polyimide having photosensitivity on the first electrode 31 and thereafter performing patterning of the polyimide film by means of a photolithography method. The organic layer 33 may be formed by means of a vapor-deposition method, for example. The second electrode 34 may be formed, for example, by forming, as a film, indium-zinc oxide (IZO) having a thickness of 150 nm on the entire surface of the display region 1A by means of a sputtering method. Upon formation of the second electrode 34, for example, a hard mask may be used. The second electrode 34 may extend from the display region 1A to the peripheral region 1B, and may be electrically coupled to the second wiring layer 18b.

The formation of the second electrode 34 may be followed by formation of the protective film 35 on the second electrode 34 by means of a CVD method, for example. Thereafter, the layers formed on the first substrate 11 may be sealed by the second substrate 41. In a specific but non-limiting example, the second substrate 41 may be joined onto the protective film 35, with the filling layer 43 being interposed therebetween. In addition, the sealing section 44 may be formed on the periphery of the second substrate 41. For example, the filling layer 43 may be formed, as a film, by means of a coating method. The sealing section 44 may be formed by means of a printing method. The color filter layer 42 may be formed in advance on the second substrate 41. In this manner, the display unit 1 is manufactured.

[Workings and Effects]

In the display unit 1 according to any example embodiment of the disclosure, a selection pulse may be supplied to the switching transistor WsTr of each of the pixels P from the scanning line driver 3 to select a pixel P. A signal voltage corresponding to an image signal supplied from the signal line driver 4 may be supplied to the selected pixel P, and may be stored in the storage capacitor Cs. The driving transistor DsTr may be subjected to ON/OFF control in response to the signal stored by the storage capacitor Cs, and a drive current may be injected into the organic EL element 30. This allows for generation of light emission through recombination of holes and electrons in the organic EL element 30, i.e., in the light emission layer 333. The light may be extracted, for example, through the second electrode 34, the protective film 35, the filling layer 43, the color filter layer 42, and the second substrate 41. This causes red light, green light, and blue light to be emitted from the respective pixels P, i.e., the pixels pr, pg, and pb, respectively. Additive color mixture of the color beams allows color image display to be performed.

In the present example embodiment, the first wiring layers 12, i.e., the first wiring layers 12-1 and 12-2 are each disposed at the position closer to the first substrate 11 than the position in the same layer as the gate electrode 16a and the source-drain electrodes 18c and 18d. The first wiring layers 12 may be formed in the process prior to the process in which the gate electrode 16a and the source-drain electrodes 18c and 18d are formed. Factors such as the constituent material and the thickness of the first wiring layer 12 may be freely selected regardless of factors such as the constituent material and the thickness of each of the gate electrode 16a and the source-drain electrodes 18c and 18d. This is to be described hereinafter.

Figure 11:
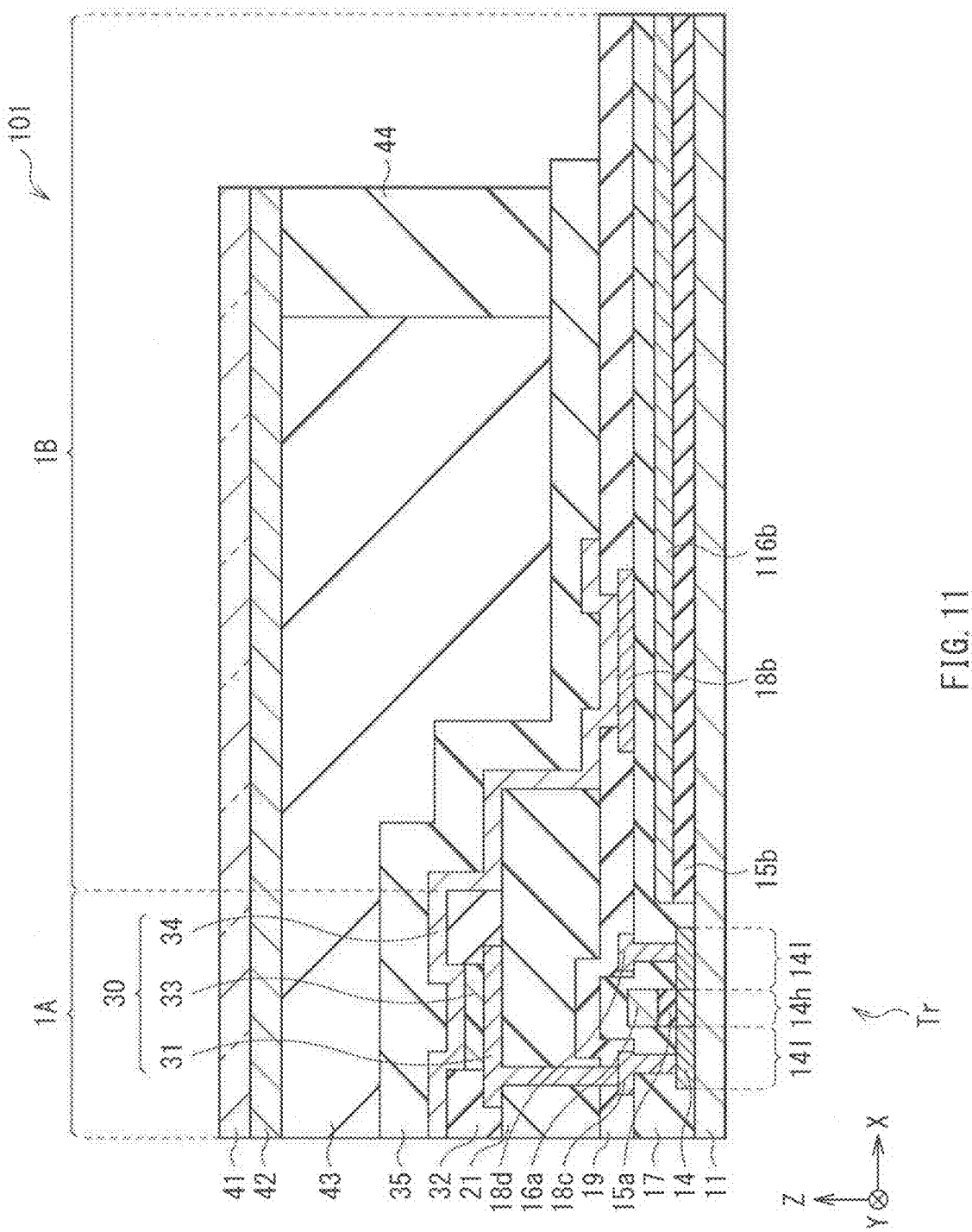
FIG. 11 is a schematic cross-sectional view of a configuration of a main part of a display unit according to Comparative Example 1.

FIG. 11 illustrates a schematic cross-sectional configuration of a main part of a display unit, i.e., a display unit 101 according to Comparative Example 1. The display unit 101 is provided with a first wiring layer, i.e., a first wiring layer 116b in the same layer as the gate electrode 16a in the peripheral region 1B. A signal or power is supplied to the transistor Tr of the display region 1A via the first wiring layer 116b. The first wiring layer 116b is led out to the outside of the sealing section 44 from a vicinity on the periphery of the display region 1A.

In such a display unit 101, the first wiring layer 116b is formed in the same process as the gate electrode 16a, and a constituent material of the first wiring layer 116b is the same as the constituent material of the gate electrode 16a. Further, the first wiring layer 116b also has a thickness that is substantially the same as the thickness of the gate electrode 16a. Accordingly, in a case where the thickness of the gate electrode 16a is increased, the thickness of the first wiring layer 116b is also increased. As used herein, the phrase "case where the thickness of the gate electrode 16a is increased" refers to, for example, a case of increasing a screen size of the display unit 101, or a case of addressing a demand for higher resolution. When the thickness of the first wiring layer 116b is increased, collapse may occur in the shape of an end surface of the first wiring layer 116b, and thus pressure resistance of the second inorganic insulating film 17 on the first wiring layer 116b is likely to be lowered. Due to the lowering of the pressure resistance of the second inorganic insulating film 17, there is a possibility that a short circuit may occur between the first wiring layer 116b and the second wiring layer 18b that face each other, with the second inorganic insulating film 17 being interposed therebetween.

It is conceivable to use, for the second inorganic insulating film 17, a material with high coatability, for example, a silicon nitride (SiNx)-based material, in order to securely insulate the first wiring layer 116b and the second wiring layer 18b from each other. However, the second inorganic insulating film 17 in contact with the semiconductor layer 14 is likely to influence characteristics of the transistor Tr. For example, when a silicon nitride (SiNx)-based material containing hydrogen is used for the second inorganic insulating film 17, a reduction reaction occurs in the semiconductor layer 14 including an oxide semiconductor material, causing occurrence of depletion in the transistor Tr.

Further, when the collapse occurs in the shape of the end surface of the first wiring layer 116b, a gap, i.e., a crack is generated between the first wiring layer 116b and the second inorganic insulating film 17, and thus moisture ingress from the outside is likely to occur via this crack. In other words, the first wiring layer 116b extending outside the sealing section 44 is likely to be a moisture ingress path from the outside. There is a possibility that this moisture ingress may cause display failure and corrosion of a wiring line, for example.

Meanwhile, in the present example embodiment, the first wiring layers 12, i.e., the first wiring layers 12-1 and 12-2 are each disposed at a position closer to the first substrate 11 than the position in the same layer as the gate electrode 16a and the source-drain electrodes 18c and 18d. This makes it possible to form the first wiring layers 12 in a process different from the process in which the gate electrode 16a and the source-drain electrodes 18c and 18d are formed. Accordingly, it becomes possible to freely design factors such as the constituent material and the thickness of the first wiring layer 12 regardless of factors such as the constituent material and the thickness of each of the gate electrode 16a and the source-drain electrodes 18c and 18d. Hence, even in a case where the gate electrode 16a and the source-drain electrodes 18c and 18d each have a large thickness, it is possible to make the thickness of the first wiring layer 12 smaller than the thickness of each of the gate electrode 16a and the source-drain electrodes 18c and 18d, thus making it possible to suppress or prevent the collapse in the shape of the end surface of the first wiring layer 12. The first wiring layer 12 having a small thickness enables a forward tapered cross-sectional shape to be easily formed.

In this manner, the use of the first wiring layer 12 having the forward tapered cross-sectional shape makes it possible to suppress or prevent occurrence of a short circuit between the first wiring layer 12-1 and the second wiring layer 18b caused by the collapse in the shape of the end surface of the first wiring layer 12. In addition, intervention of the first inorganic insulating film 13 together with the second inorganic insulating film 17 between the first wiring layer 12-1 and the second wiring layer 18b makes it possible to suppress the occurrence of a short circuit more effectively.

By freely designing factors such as the constituent material and the thickness of the first wiring layer 12 to form the first wiring layer 12 having a smaller thickness, it becomes possible to suppress the moisture ingress from the outside caused by the collapse in the shape of the end surface of the first wiring layer 12, even when the first wiring layer 12-2 is provided in the vicinity of the sealing section 44.

As described above, in the display unit 1, the first wiring layers 12 are each disposed at a position closer to the first substrate 11 than the position in the same layer as the gate electrode 16a and the source-drain electrodes 18c and 18d. This makes it possible to freely design factors such as the constituent material and the thickness of the first wiring layer 12 regardless of factors such as the constituent material and the thickness of each of the gate electrode 16a and the source-drain electrodes 18c and 18d. Hence, it is possible to enhance a degree of freedom in designing wiring lines provided in the peripheral region 1B.

Freely designing factors such as the constituent material and the thickness of the first wiring layer 12 makes it possible to suppress, for example, the occurrence of a short circuit between the first wiring layer 12 and the second wiring layer 18*b* as well as the moisture ingress from the outside.

Description is given below of modification examples of the foregoing first example embodiment and another example embodiment. In the following description, the same reference numerals are assigned to the same components as those of the foregoing example embodiment, and descriptions thereof are omitted where appropriate.

MODIFICATION EXAMPLE 1

Figure 12:
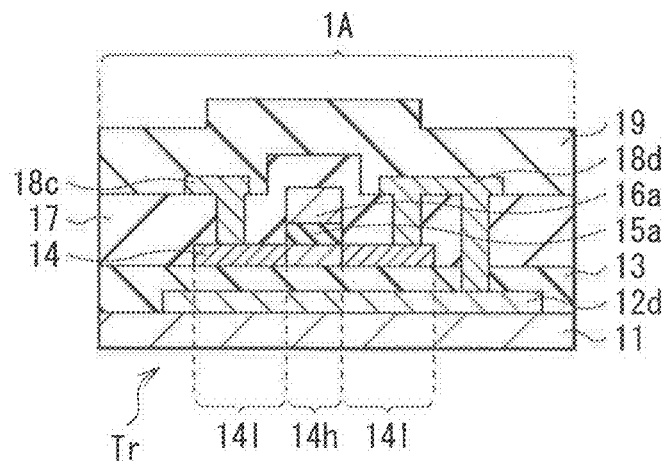
FIG. 12 is a schematic cross-sectional view of a configuration of a main part of a transistor according to Modification Example 1.
Figure 13:
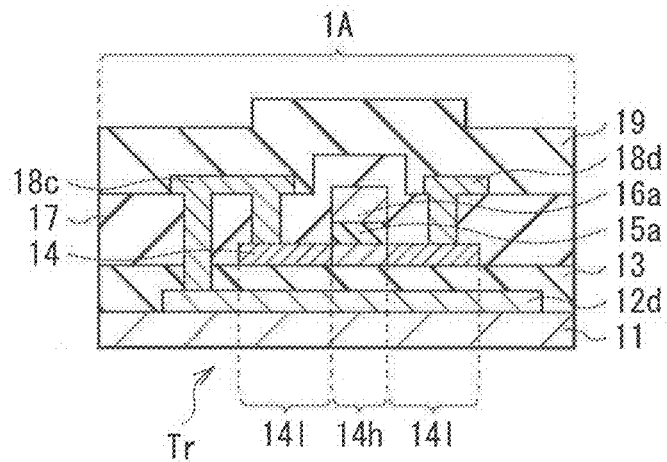
FIG. 13 is a schematic cross-sectional view of another example of the transistor illustrated in FIG. 12.
Figure 14:
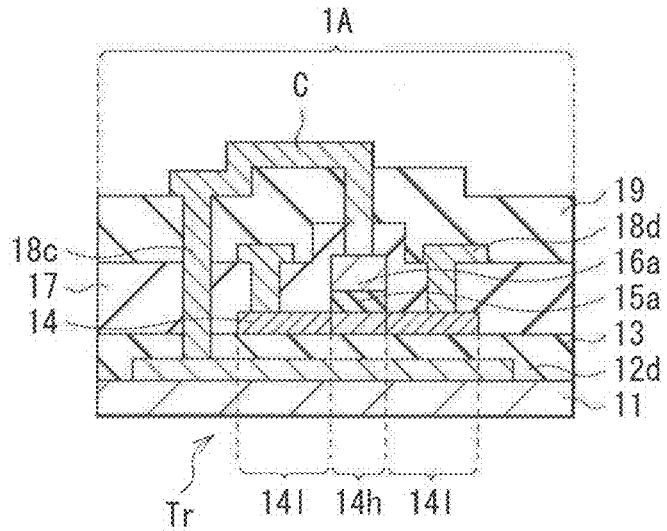
FIG. 14 is a schematic cross-sectional view of yet another example of the transistor illustrated in FIG. 12.

FIGS. 12 to 14 each schematically illustrate a cross-sectional configuration of the transistor Tr according to Modification Example 1. The transistor Tr may include an additional electrode, i.e., an additional electrode 12*d* provided at a position in the same layer as the first wiring layer 12. Except this point, the transistor Tr of Modification Example 1 has configurations similar to those of the transistor Tr of the foregoing first example embodiment, and workings and effects thereof are also similar.

The additional electrode 12*d* may be disposed at a position facing the semiconductor layer 14, with the first inorganic insulating film 13 being interposed therebetween. In this manner, the provision of the additional electrode 12*d* that faces the semiconductor layer 14 makes it possible to suppress degradation in the characteristics of the transistor Tr caused by light incident on the semiconductor layer 14, because of the semiconductor layer 14 being shielded from light.

The additional electrode 12*d* may be electrically coupled to the source-drain electrodes 18*c* and 18*d* via contact holes provided in the second inorganic insulating film 17 and the first inorganic insulating film 13, as illustrated in FIGS. 12 and 13. Electrically coupling the additional electrode 12*d* to the source-drain electrodes 18*c* and 18*d* makes it possible to stabilize the characteristics of the transistor Tr. In an alternative embodiment, as illustrated in FIG. 14, a wiring line, i.e., a wiring line C may be provided on the third inorganic insulating film 19 to electrically couple the additional electrode 12*d* to the gate electrode 16*a*. Electrically coupling the additional electrode 12*d* to the gate electrode 16*a* makes it possible to increase an ON-current.

It is possible for the additional electrode 12*d* to be formed in the same process as the first wiring layer 12. Accordingly, in the transistor Tr according to Modification Example 1, it is possible to suppress incidence of light on the semiconductor layer 14, without adding a new process, as compared with the transistor Tr described in the foregoing first example embodiment. Further, the additional electrode 12*d* electrically coupled to the source-drain electrodes 18*c* and 18*d* enables the characteristics to be stabilized, and the additional electrode 12*d* electrically coupled to the gate electrode 16*a* enables the ON-current to be increased.

MODIFICATION EXAMPLE 2

Figure 15:
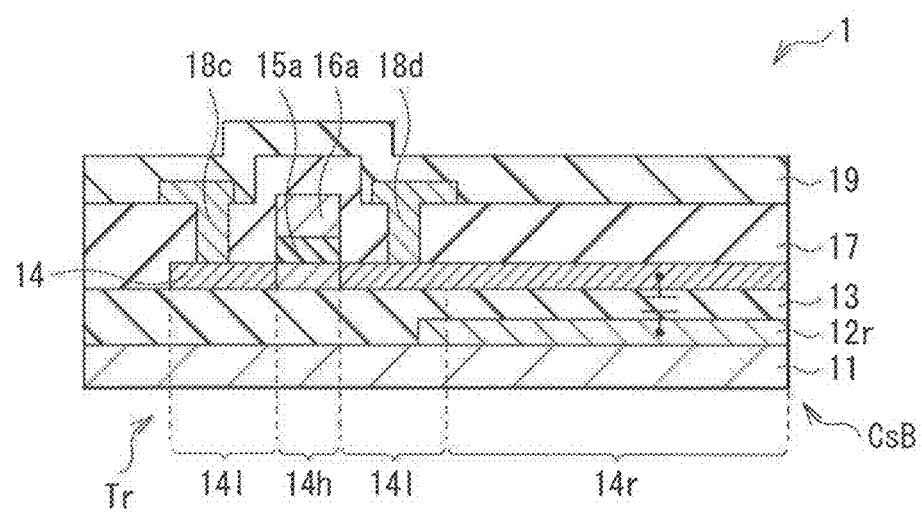
FIG. 15 is a schematic cross-sectional view of a configuration of a main part of a display unit according to Modification Example 2.
Figure 16:
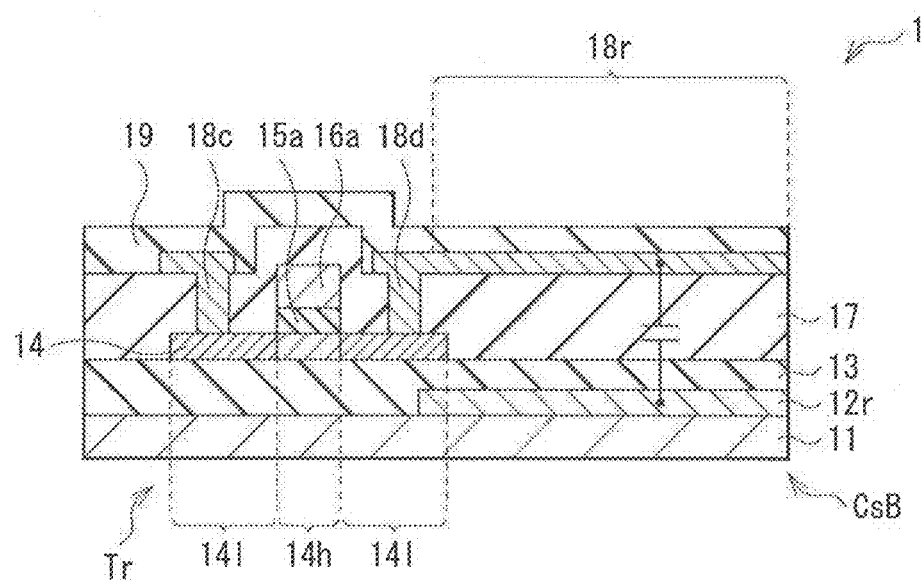
FIG. 16 is a schematic cross-sectional view of another example of the display unit illustrated in FIG. 15.

FIGS. 15 and 16 each schematically illustrate a cross-sectional configuration of a main part of the display unit 1 according to Modification Example 2. The display unit 1 may include an electrode, i.e., an electrode 12*r*. The electrode 12*r* may be provided at a position in the same layer as the first wiring layer 12, and may configure one of a pair of electrodes of a storage capacitor, i.e., a storage capacitor CsB. Except this point, the display unit 1 of Modification Example 2 has configurations similar to those of the display unit 1 of the foregoing first example embodiment, and workings and effects thereof are also similar.

The other electrode of the storage capacitor CsB may be configured, for example, by the semiconductor layer 14, as illustrated in FIG. 15. In this storage capacitor CsB, a storage capacitor part 14*r* may be provided in the semiconductor layer 14, and the electrode 12*r* may be provided at a position facing the storage capacitor part 14*r*. In other words, the storage capacitor CsB may include a pair of electrodes, i.e., the electrode 12*r* and the semiconductor layer 14, with the first inorganic insulating film 13 being interposed therebetween.

The other electrode of the storage capacitor CsB may be configured, for example, by the source-drain electrode 18*d*, as illustrated in FIG. 16. In this storage capacitor CsB, a storage capacitor part 18*r* may be provided in the source-drain electrode 18*d*, and the electrode 12*r* may be provided at a position facing the storage capacitor part 18*r*. In other words, the storage capacitor CsB may include a pair of electrodes, i.e., the electrode 12*r* and the source-drain electrode 18*d*, with the first inorganic insulating film 13 and the second inorganic insulating film 17 being interposed therebetween.

It is possible for the additional electrode 12*r* to be formed in the same process as the first wiring layer 12. Accordingly, in the display unit 1 according to Modification Example 2, it is possible to provide the storage capacitor CsB without adding a new process, as compared with the display unit 1 described in the foregoing first example embodiment.

Second Example Embodiment

Figure 17:
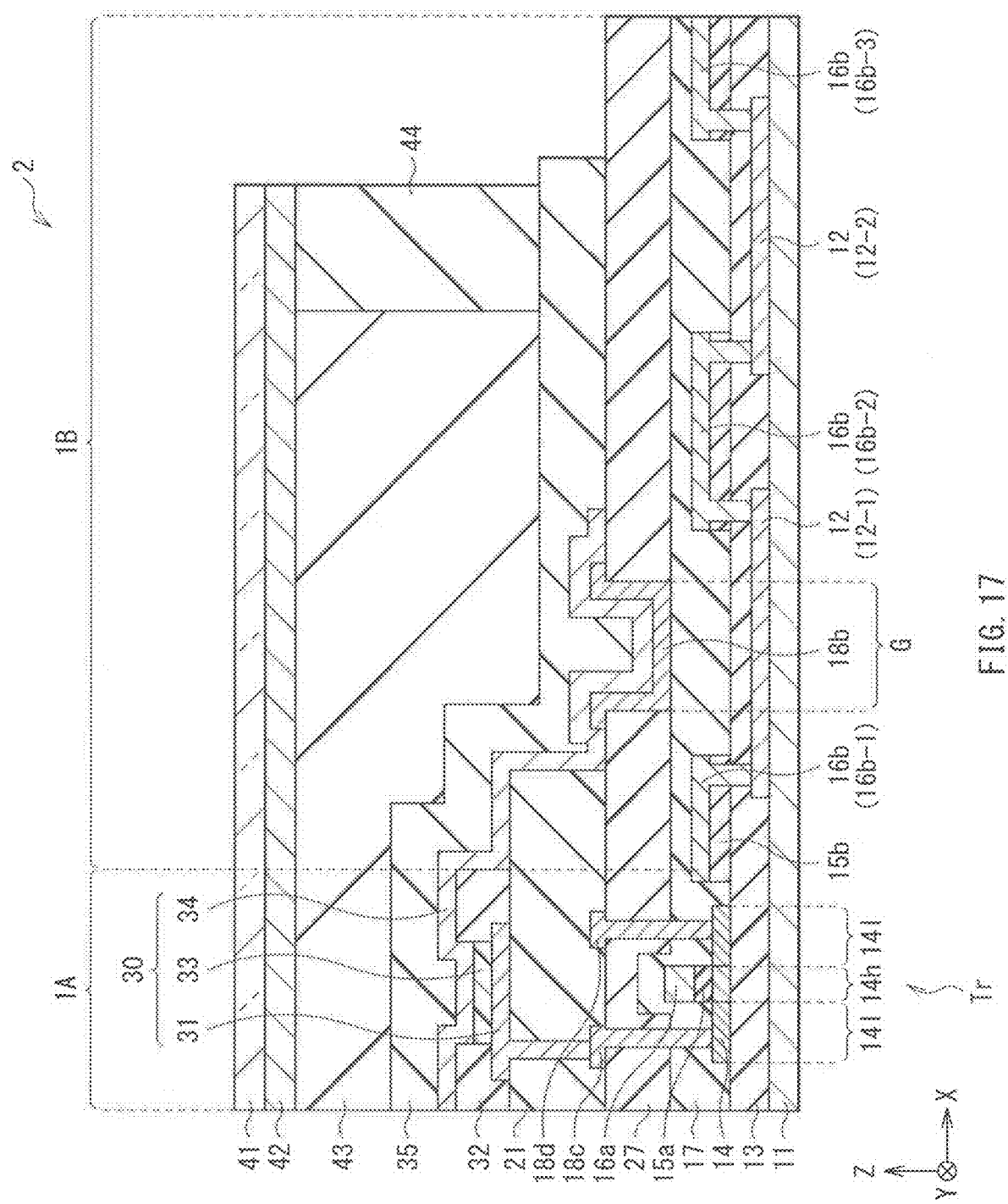
FIG. 17 is a schematic cross-sectional view of a configuration of a main part of a display unit according to one embodiment of the disclosure.

FIG. 17 schematically illustrates a cross-sectional configuration of a main part of a display unit, i.e., a display unit 2 according to the second example embodiment of the technology. The display unit 2 may include, between the gate electrode 16*a* and each of the source-drain electrodes 18*c* and 18*d*, an organic insulating film 27 that is stacked on the second inorganic insulating film 17. Except this point, the display unit 2 has configurations similar to those of the display unit 1 of the foregoing first example embodiment, and workings and effects thereof are also similar.

The organic insulating film 27 may extend from the display region 1A to the peripheral region 1B, and may cover the gate electrode 16*a* and the connection wiring layer 16*b*, with the second inorganic insulating film 17 being interposed therebetween. The organic insulating film 27 may be provided between the second inorganic insulating film 17 and each of the source-drain electrodes 18*c* and 18*d* and between the second inorganic insulating film 17 and the second wiring layer 18*b*. The organic insulating film 27 may be made of, for example, an organic material such as an acrylic resin, polyimide (PI), and a novolak resin. The organic insulating film 27 may have a thickness of 2 μm to 3 μm. By allowing the organic insulating film 27 having such a sufficient thickness to cover the gate electrode 16*a* and the gate insulating film 15*a* as well as the connection wiring layer 16*b* and the under-wiring insulating film 15*b*, it becomes possible to suppress occurrence of a malfunction caused by these step differences.

Further, by providing the organic insulating film 27 between the second inorganic insulating film 17 and each of the source-drain electrodes 18*c* and 18*d* and between the second inorganic insulating film 17 and the second wiring layer 18*b*, it becomes possible to reduce a parasitic capacitance between wiring lines, e.g., between the gate electrode 16*a* and each of the source-drain electrodes 18*c* and 18*d*.

The organic insulating film 27 may be provided with a groove G in the peripheral region 1B. The organic insulating material as described above may have a moisture vapor transmission rate (MVTR) higher than that of an inorganic insulating material. Accordingly, providing the groove G in the organic insulating film 27 having a relatively high moisture vapor transmission rate allows for blocking of the moisture ingress path to the display region 1A from the outside of the groove G. Hence, providing the groove G in the organic insulating film 27 makes it possible to suppress the moisture ingress into the display region 1A via the organic insulating film 27. The groove G may be disposed at a position, of the peripheral region 1B, close to the display region 1A, for example. The groove G may be provided to penetrate the organic insulating film 27, for example. In the groove G, the second inorganic insulating film 17 may be exposed from the organic insulating film 27. The groove G may be provided to surround the display region 1A in a plan view.

The second wiring layer 18b may be provided, for example, at a position overlapping the groove G in a plan view. The second wiring layer 18b may be provided along from a wall surface to a bottom surface of the groove G. In the present example embodiment, the first wiring layer 12-1 may be provided at a position facing the second wiring layer 18b provided in the groove G. This enables the groove G to be provided in the organic insulating film 27 and enables suppression or prevention of the occurrence of the short circuit between the first wiring layer 12-1 and the second wiring layer 18b, although the detail is described later.

Figure 18A:
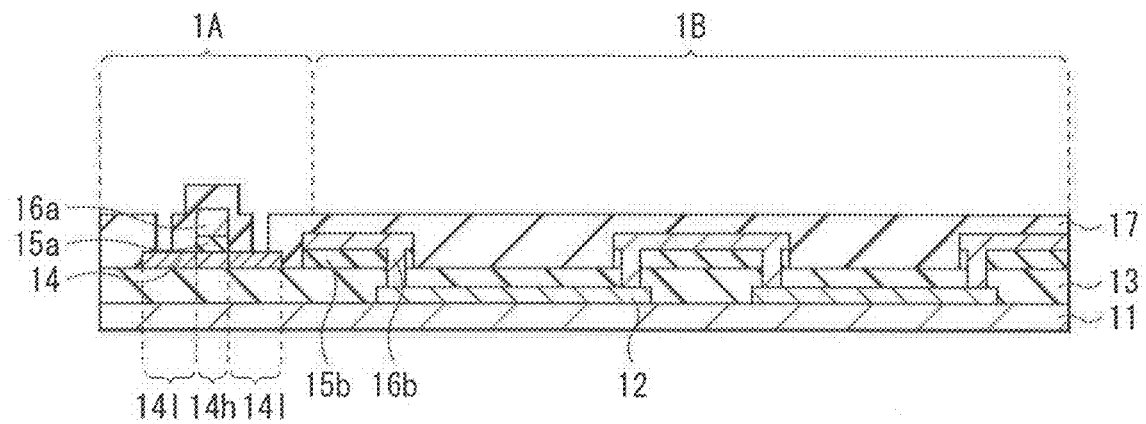
FIG. 18A is a schematic cross-sectional view of one process of a method of manufacturing the display unit illustrated in FIG. 17.
Figure 18B:
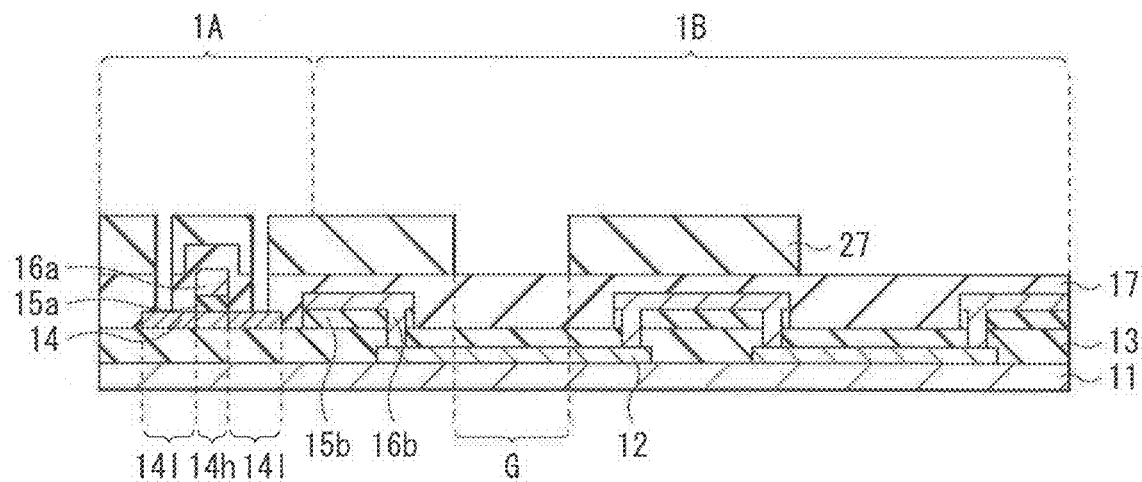
FIG. 18B is a schematic cross-sectional view of a process subsequent to FIG. 18A.
Figure 19:
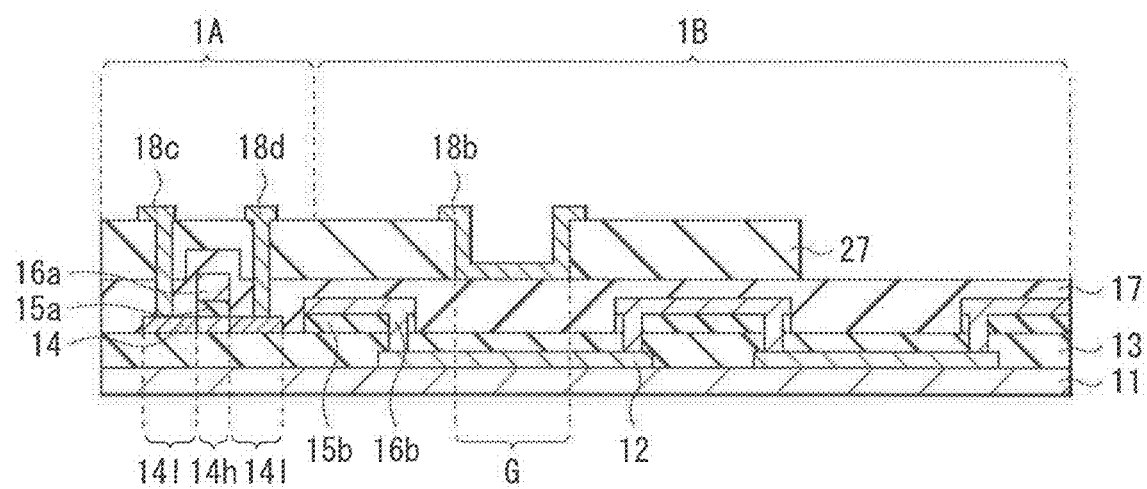
FIG. 19 is a schematic cross-sectional view of a process subsequent to FIG. 18B.

The display unit 2 may be manufactured, for example, as described below, as illustrated in FIGS. 18A to 19.

Similarly to the description in the foregoing first example embodiment, the second inorganic insulating film 17 may be first formed as illustrated in FIG. 18A. Contact holes reaching the low-resistance regions 141 of the semiconductor layer 14 may be formed in the second inorganic insulating film 17.

As illustrated in FIG. 18B, the organic insulating film 27 may be next formed on the second inorganic insulating film 17. The organic insulating film 27 may be formed, for example, by forming, as a film, polyimide having photosensitivity on the second inorganic insulating film 17 and thereafter performing patterning of the polyimide by means of a photolithography method. Contact holes and the groove G may be formed in the organic insulating film 27. The contact holes formed in the organic insulating film 27 may reach the low-resistance regions 141 of the semiconductor layer 14 via the contact holes provided in the second inorganic insulating film 17.

The formation of the organic insulating film 27 may be followed by formation of the source-drain electrodes 18c and 18d and the second wiring layer 18b as illustrated in FIG. 19. The second wiring layer 18b may be formed in the groove G of the organic insulating film 27. Thereafter, components such as the planarizing layer 21 and the organic EL element 30 may be formed on the first substrate 11, similarly to the description in the foregoing first example embodiment. The third inorganic insulating film 19 may be formed between the organic insulating film 27 and the planarizing layer 21. The layers formed on the first substrate 11 may be sealed by the second substrate 41 to manufacture the display unit 2.

In the present example embodiment, the first wiring layers 12, i.e., the first wiring layers 12-1 and 12-2 are each disposed at a position closer to the first substrate 11 than the position in the same layer as the gate electrode 16a and the source-drain electrodes 18c and 18d. This enables the groove G to be provided in the organic insulating film 27 and enables suppression or prevention of the occurrence of the short circuit between the first wiring layer 12-1 and the second wiring layer 18b. This is to be described hereinafter.

Figure 20:
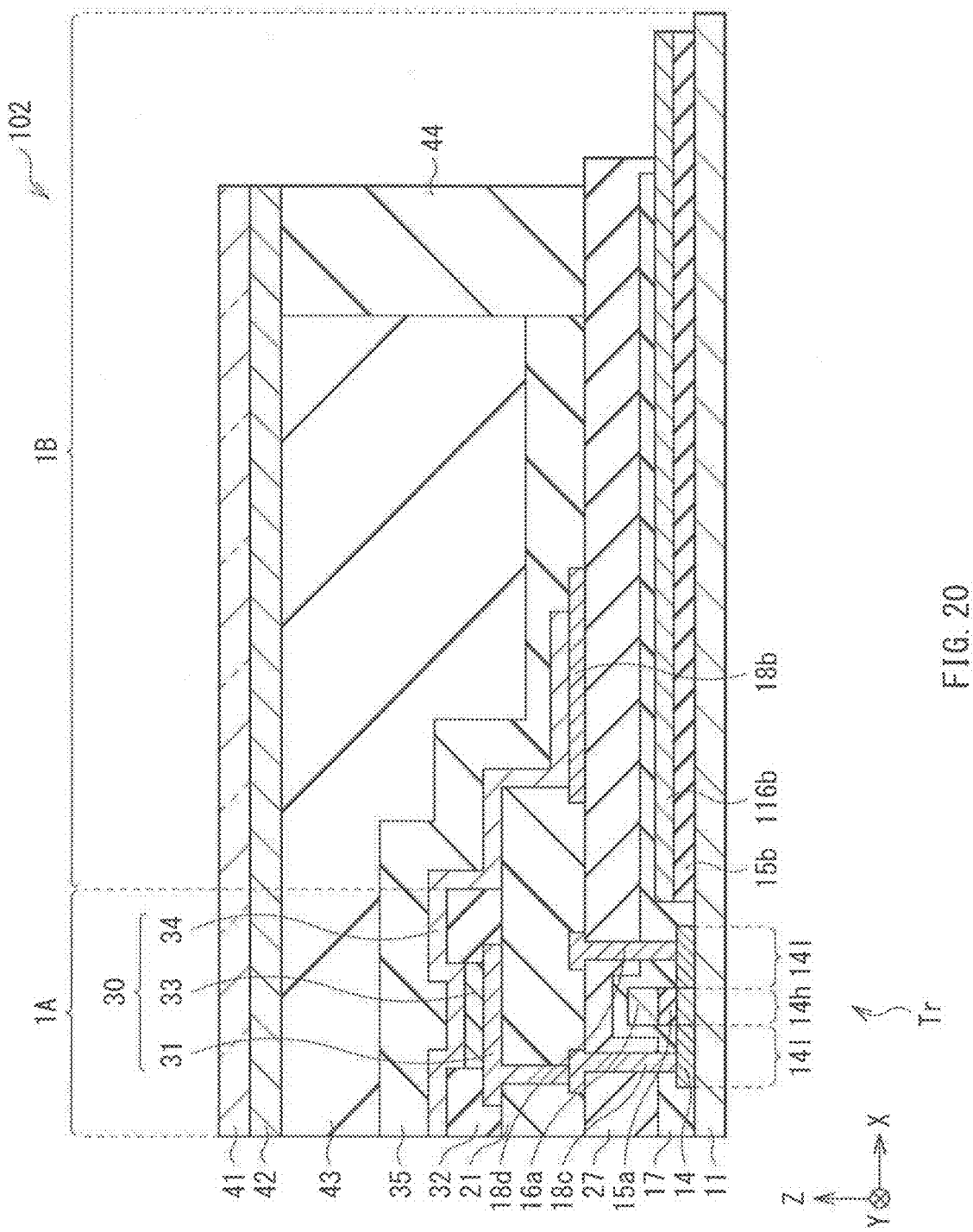
FIG. 20 is a schematic cross-sectional view of a configuration of a main part of a display unit according to Comparative Example 2.

FIG. 20 illustrates a schematic cross-sectional configuration of a main part of a display unit, i.e., a display unit 102 according to Comparative Example 2. The display unit 102 includes, between the gate electrode 16a and the source-drain electrodes 18c and 18d, the organic insulating film 27 together with the second inorganic insulating film 17. Except this point, the display unit 102 has configurations similar to those of the foregoing display unit 101. That is, the display unit 102 may include the first wiring layer 116b in the same layer as the gate electrode 16a in the peripheral region 1B.

In such a display unit 102, the organic insulating film 27 intervenes between the first wiring layer 116b and the second wiring layer 18b, together with the second inorganic insulating film 17. This makes a short circuit unlikely to occur between the first wiring layer 116b and the second wiring layer 18b. However, there is a possibility that moisture ingress from the outside may occur via the organic insulating film 27 having a high moisture vapor transmission rate to cause occurrence of display failure and corrosion of a wiring line, for example.

Meanwhile, in the present example embodiment, the provision of the groove G in the organic insulating film 27 makes it possible to suppress moisture ingress from the outside. Further, the provision of the first wiring layer 12 at a position closer to the first substrate 11 than the gate electrode 16a makes it possible to allow the thickness of the first wiring layer 12-1 to be smaller than the thickness of the gate electrode 16a and to suppress the collapse in the shape of the end surface thereof. Hence, it is possible to suppress or prevent the occurrence of the short circuit between the first wiring layer 12-1 and the second wiring layer 18b, even when the second wiring layer 18b is disposed in the groove G. Moreover, similarly to the description in the foregoing first example embodiment, the first wiring layer 12-2 having a thickness smaller than a thickness of the gate electrode 16a suppresses moisture ingress caused by the collapse in the shape of the end surface.

MODIFICATION EXAMPLE 3

Figure 21:
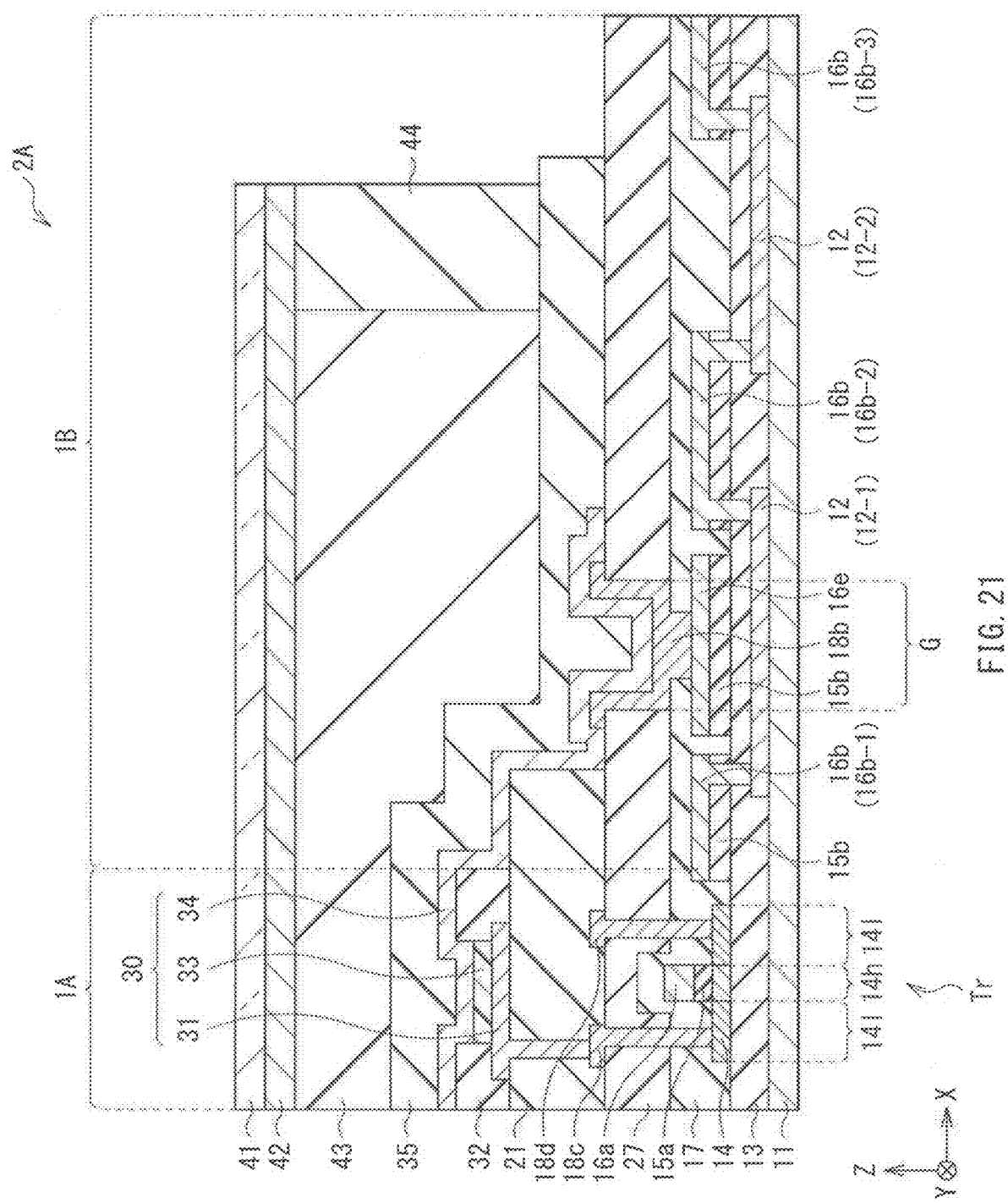
FIG. 21 is a schematic cross-sectional view of a configuration of a main part of a display unit according to Modification Example 3.

FIG. 21 schematically illustrates a cross-sectional configuration of a main part of a display unit, i.e., a display unit 2A according to a modification example, i.e., Modification Example 3 of the foregoing second example embodiment. The display unit 2A may include the under-wiring insulating film 15b provided in a region facing the second wiring layer 18b. Except this point, the display unit 2A has configurations similar to those of the display unit 2 of the foregoing second example embodiment, and workings and effects thereof are also similar.

The under-wiring insulating film 15b in a region facing the second wiring layer 18b may be provided on the first inorganic insulating film 13. A connection wiring layer, i.e., a connection wiring layer 16e electrically coupled to the second wiring layer 18b may be provided on the under-wiring insulating film 15b. The second wiring layer 18b may be coupled to the connection wiring layer 16e via a contact hole provided in the groove G of the organic insulating film 27 and the second inorganic insulating film 17. That is, the connection wiring layer 16e may be provided in the same layer as the connection wiring layer 16b (or the gate electrode 16a), and the under-wiring insulating film 15b may be provided in the same layer as the under-wiring insulating film 15b (or the gate insulating film 15a) located between the first inorganic insulating film 13 and the connection wiring layer 16b.

In the display unit 2A, the connection wiring layer 16e electrically coupled to the second wiring layer 18b and the first wiring layer 12-1 may face each other, with the first inorganic insulating film 13 and the under-wiring insulating film 15b being interposed therebetween. In this manner, the provision of the under-wiring insulating film 15b between the first wiring layer 12-1 and the second wiring layer 18b, i.e., the connection wiring layer 16e makes it easier to ensure an insulating property therebetween even in a case where the second inorganic insulating film 17 has a small thickness. For example, when the second inorganic insulating film 17 is configured by an aluminum oxide (AlO) film having a thickness of 50 nm in consideration of factors such as costs, the under-wiring insulating film 15b may be configured by a silicon oxide (SiO) film having a thickness of 200 nm. In one embodiment, the under-wiring insulating film 15b and the connection wiring layer 16e may each have a width (i.e., a size in an X direction in FIG. 21) that is larger than a width of the second wiring layer 18b inside the groove G.

Further, coupling the connection wiring layer 16e on the under-wiring insulating film 15b to the second wiring layer 18b makes it possible to suppress or prevent the connection wiring layer 16e from being brought into an electrically floating state.

Figure 22:
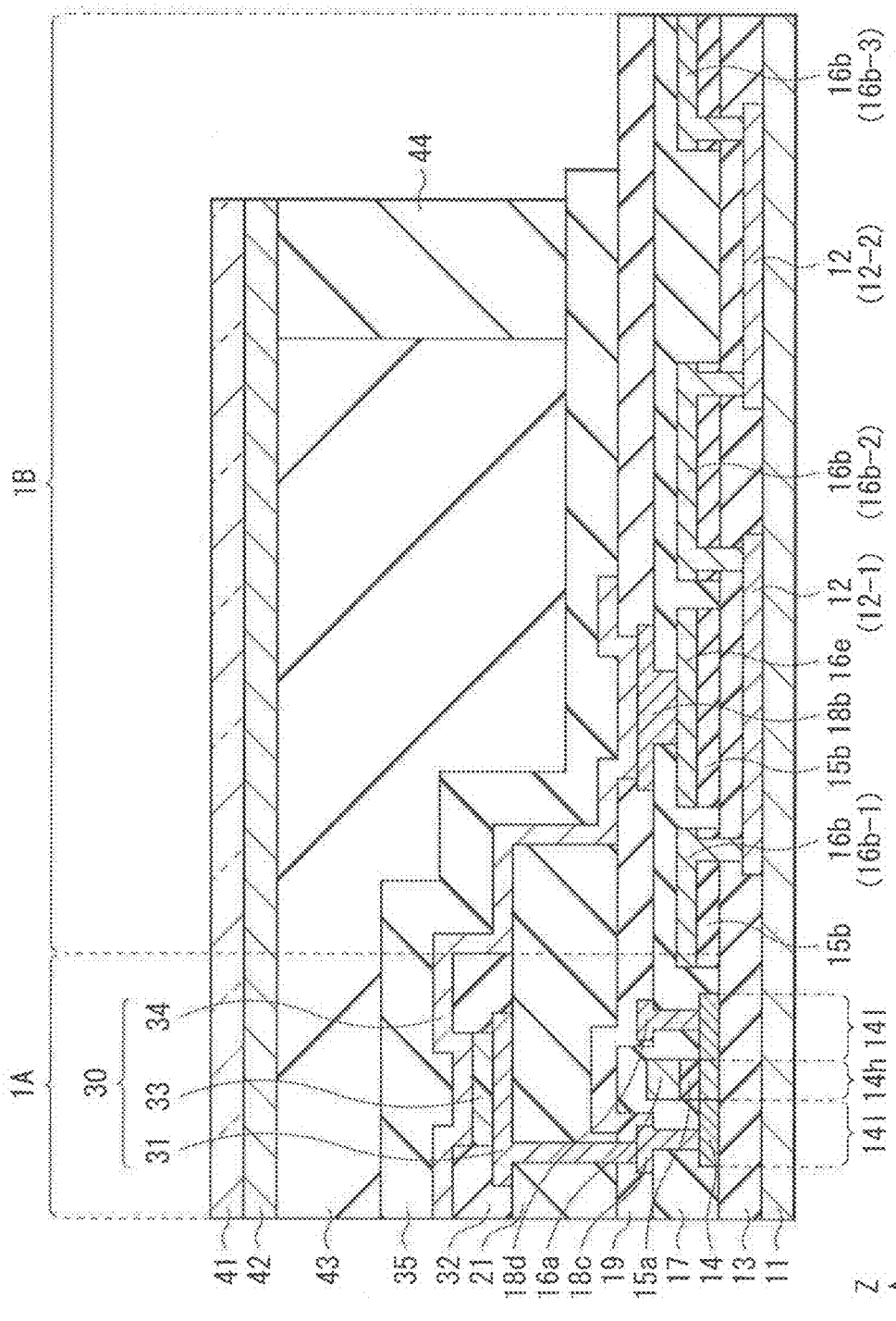
FIG. 22 is a schematic cross-sectional view of another example of the display unit illustrated in FIG. 21.

FIG. 22 illustrates an example in which the display unit 1 of the foregoing first example embodiment is provided with the under-wiring insulating film 15b located between the second wiring layer 18b and the first wiring layer 12-1. In this manner, the display unit 1 may include the connection wiring layer 16e electrically coupled to the second wiring layer 18b and the under-wiring insulating film 15b located between the connection wiring layer 16e and the first inorganic insulating film 13.

APPLICATION EXAMPLE

<Example of Electronic Apparatus>

Figure 23:
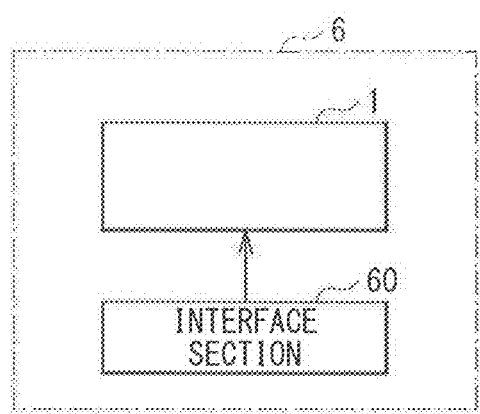
FIG. 23 is a block diagram illustrating a configuration of an electronic apparatus.

Any of the display units 1 and 2 described in the foregoing example embodiments may be applied to various types of electronic apparatuses. FIG. 23 illustrates a functional block configuration of an electronic apparatus 6. Specific but non-limiting examples of the electronic apparatus 6 may include a television, a personal computer (PC), a smartphone, a tablet PC, a mobile phone, a digital still camera, and a digital video camera.

The electronic apparatus 6 may include, for example, any of the above-described display units 1 and 2 and an interface section 60. The interface section 60 may be an input section that receives various signals and a power supply, for example, from the outside. The interface section 60 may include a user interface such as a touch panel, a keyboard, and operation buttons, for example.

Although description has been given hereinabove with reference to the example embodiments and the modification examples, the technology is not limited thereto, but may be modified in a wide variety of ways. For example, factors such as a material and a thickness of each layer, and a film-forming method as well as a film-forming condition exemplified in the foregoing example embodiment, etc. are illustrative and non-limiting. Any other material, any other thickness, any other film-forming method, any other film-forming condition, and any other factor may be adopted besides those described above.

It is sufficient that the organic layer 33 may include at least the light emission layer 333. For example, the organic layer 33 may be configured only by the light emission layer 333. The light emission layer 333 may emit white light, for example. The organic layer 33 may include the light emission layer 333 in which all of the pixels pr, pg, and pb emit light of the same color (e.g., white light). In an alternative embodiment, the organic layer 33 may include the light emission layer 333 in which the pixels pr, pg, and pb emit light of different colors (e.g., red light, green light, and blue light).

Although description has been given in the foregoing example embodiments by exemplifying the transistor Tr having the top-gate structure, the transistor Tr may also have a bottom-gate structure. Further, the configuration of the pixel circuit PXLC is not limited to that described in the foregoing example embodiment. A capacitor element or a transistor may be added as necessary. In this case, any other necessary drive circuit may be added in response to variation in the pixel circuit PXLC, besides the scanning line driver 3, the signal line driver 4, and the power supply line driver 5.

Further, description has been given, in the foregoing example embodiments, etc., of the case where the first wiring layer 12 is provided at a position closer to the first substrate 11 than the same layer as the gate electrode 16a, with the connection wiring layer 16b being provided in the same layer as the gate electrode 16a. However, the first wiring layer 12 may be provided at a position closer to the first substrate 11 than the same layer as the source-drain electrodes 18c and 18d, with the connection wiring layer 16b being provided in the same layer as the source-drain electrodes 18c and 18d.

Moreover, although description has been given, in the foregoing example embodiments, etc., of the case where the second wiring layer 18b is electrically coupled to the second electrode 34 of the organic EL element 30, the second wiring layer 18b may have an electric potential other than the cathode electric potential.

In addition, the display unit 1 may include a display element such as an inorganic EL element, a liquid crystal display element, and an electrophoretic element, instead of the organic EL element 30.

The effects described in the foregoing example embodiments are mere examples. The effects according to an embodiment of the disclosure may be other effects, or may further include other effects in addition to the effects described hereinabove.

It is to be noted that the technology may also have the following configurations.

(1)

A display unit including:

a first substrate provided with a display region and a peripheral region outside the display region;

a transistor provided in the display region on the first substrate, the transistor including a semiconductor layer, a gate electrode that faces the semiconductor layer, a gate insulating film located between the gate electrode and the semiconductor layer, and a source-drain electrode electrically coupled to the semiconductor layer;

a first wiring layer provided in the peripheral region on the first substrate, the first wiring layer being electrically coupled to the transistor and being disposed at a position closer to the first substrate than a position in same layer as the gate electrode and the source-drain electrode of the transistor;

a second wiring layer provided on the first substrate, the second wiring layer having an electric potential that is different from an electric potential of the first wiring layer; and an insulating film provided between the second wiring layer and the first wiring layer.

(2)

The display unit according to (1), in which the first wiring layer has a thickness that is smaller than each of a thickness of the gate electrode and a thickness of the source-drain electrode.

(3)

The display unit according to (1) or (2), further including a connection wiring layer that is provided in the same layer as the gate electrode or the source-drain electrode, and is electrically coupled to the first wiring layer.

(4)

The display unit according to any one of (1) to (3), further including a display element provided in the display region on the first substrate, the display element including a first electrode, an organic layer, and a second electrode.

(5)

The display unit according to any one of (1) to (4), in which the transistor includes, in order from a position close to the first substrate, the semiconductor layer, the gate insulating film, the gate electrode, and the source-drain electrode.

(6)

The display unit according to (5), in which the insulating film includes a first insulating film that covers the first wiring layer, and a second insulating film that is provided between the gate electrode and the source-drain electrode, the second insulating film extending to the peripheral region.

(7)

The display unit according to (6), further including an organic insulating film that is provided between the gate electrode and the source-drain electrode and is stacked on the second insulating film, the organic insulating film extending to the peripheral region.

(8)

The display unit according to (7), in which the organic insulating film has a groove in the peripheral region, and the second wiring layer is provided in the groove.

(9)

The display unit according to (5), in which the insulating film includes a first insulating film that covers the first wiring layer, and the gate insulating film.

(10)

The display unit according to any one of (1) to (9), further including:

a sealing section that is provided in the peripheral region on the first substrate and surrounds the display region; and a second substrate that faces the first substrate, with the sealing section being interposed therebetween.

(11)

The display unit according to (10), in which the first wiring layer is provided to face the sealing section.

(12)

The display unit according to any one of (1) to (11), in which the first wiring layer extends in a direction orthogonal to the second wiring layer.

(13)

The display unit according to any one of (1) to (12), in which the semiconductor layer includes an oxide semiconductor material.

(14)

The display unit according to any one of (1) to (13), further including an additional electrode that faces the semiconductor layer and is provided in same layer as the first wiring layer, the additional electrode being electrically coupled to one of the gate electrode and the source-drain electrode.

(15)

The display unit according to any one of (1) to (14), further including a storage capacitor that includes a pair of electrodes, one of the pair of electrodes being provided in the same layer as the first wiring layer.

(16)

The display unit according to any one of (1) to (15), in which the first wiring layer includes one or more of molybdenum, titanium, tungsten, and copper.

In the display unit according to the embodiment of the technology, the first wiring layer is disposed at a position closer to the first substrate than a position in the same layer as the gate electrode and the source-drain electrode. In other words, the first wiring layer is formed in a process different from that for each of the gate electrode and the source-drain electrode. This allows for designing of factors such as a constituent material and a thickness of the first wiring layer, regardless of factors such as a constituent material and a thickness of each of the gate electrode and the source-drain electrode.

According to the display unit of the embodiment of the technology, the first wiring layer is disposed at a position closer to the first substrate than a position in the same layer as the gate electrode and the source-drain electrode. This makes it possible to freely design factors such as the constituent material and the thickness of the first wiring layer, regardless of factors such as the constituent material and the thickness of each of the gate electrode and the source-drain electrode. Hence, it becomes possible to enhance a degree of freedom in designing wiring lines provided in the peripheral region. It is to be noted that the effects described herein are not necessarily limitative, and may be any effects described in the disclosure.

Although the technology has been described in terms of exemplary embodiments, it is not limited thereto. It should be appreciated that variations may be made in the described embodiments by persons skilled in the art without departing from the scope of the technology as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably" or the like is non-exclusive and means "preferably", but not limited to. The use of the terms first, second, etc. do not denote any order or importance, but rather the terms first, second, etc. are used to distinguish one element from another. The term "substantially" and its variations are defined as being largely but not necessarily wholly what is specified as understood by one of ordinary skill in the art. The term "about" as used herein can allow for a degree of variability in a value or range. Moreover, no element or component in this disclosure is intended to be dedicated to the public regardless of whether the element or component is explicitly recited in the following claims.

What is claimed is:

1. A display unit comprising:

a first substrate comprising a display region and a peripheral region outside the display region;

a transistor in the display region on the first substrate, the transistor including a semiconductor layer, a gate electrode over the semiconductor layer, a gate insulating film between the gate electrode and the semiconductor layer, and a source-drain electrode electrically coupled to the semiconductor layer;

an organic EL element in the display region electrically connected with the transistor, the organic EL element comprises a first electrode, a second electrode and an organic layer interposed between the first and the second electrode;

a first wiring layer in the peripheral region, the first wiring layer being electrically coupled to the transistor and being closer to the first substrate than the gate electrode and the source-drain electrode of the transistor;

a second wiring layer in the peripheral region, the second wiring layer being electrically connected to the second electrode of the organic EL element; and an insulating film between the second wiring layer and the first wiring layer.

2. The display unit according to claim 1, further comprising a second insulating film over the insulating film, wherein the source drain electrode directly contacts the second insulating film.

3. The display unit according to claim 1, further comprising a second substrate, wherein the organic EL element is between the first substrate and the second substrate.

4. The display unit according to claim 3, further comprising:
a filling layer; and
a color filter layer over the filling layer, wherein the second substrate contacts the color filter layer; and
a sealing section surrounding the filling layer.

5. The display unit according to claim 4, further comprising a protective film between the filling layer and the transistor, wherein the filling layer has a thickness greater than a thickness of the protective film.

6. The display unit according to claim 5, wherein the protective film extends beyond an end of the filling layer.

7. The display unit according to claim 4, wherein the color filter layer directly contacts the sealing section.

8. The display unit according to claim 1, wherein the second electrode contacts the organic layer and the second wiring layer.

9. The display unit according to claim 1, further comprising an element separation film contacting sidewalls of the organic layer.

10. The display unit according to claim 1, further comprising a planarizing layer having a groove, wherein the first electrode is in the groove.

11. The display unit according to claim 1, further comprising:
a second insulating film over the transistor; and
a protective film over the second insulating film, wherein the second insulating film extends beyond an end of the protective film.

12. The display unit according to claim 1, wherein the second electrode comprises a first concave portion and a second concave portion, the first concave portion contacts the organic layer, and the second concave portion contacts the second wiring layer.

13. A display unit comprising:
a first substrate comprising a display region and a peripheral region outside the display region;

a transistor in the display region, the transistor including a semiconductor layer, a gate electrode over the semiconductor layer, a gate insulating film between the gate electrode and the semiconductor layer, and a source-drain electrode electrically coupled to the semiconductor layer;

a first wiring layer in the peripheral region, the first wiring layer being electrically coupled to the transistor and closer to the first substrate than the gate electrode and the semiconductor layer;

a second wiring layer in the peripheral region, the second wiring layer having an electric potential that is different from an electric potential of the first wiring layer;

a first insulating film between the second wiring layer and the first wiring layer; and a second insulating film between the second wiring layer and the first wiring layer, wherein the second insulating film is different from the first insulating film.

14. The display unit according to claim 13, wherein the first insulating film directly contacts the semiconductor layer and the second insulating film.

15. The display unit according to claim 14, further comprising a connection wiring layer, wherein the connection wiring layer has an elongated portion extending in a direction perpendicular to a surface of the first substrate, and the elongated portion contacts the first insulating film and the first wiring layer.

16. A display unit comprising:
a first substrate comprising a display region and a peripheral region outside the display region;

a transistor in the display region, wherein the transistor comprises a semiconductor layer, a gate electrode over the semiconductor layer, a gate insulating film between the gate electrode and the semiconductor layer, and a source-drain electrode electrically coupled to the semiconductor layer;

a first wiring layer in the peripheral region, wherein the first wiring layer is electrically coupled to the transistor, and a distance from first wiring layer to the first substrate in a first direction is shorter than a distance from the gate electrode to the first substrate in the first direction;

a second wiring layer in the peripheral region, wherein the second wiring layer has a different electrical potential from the first wiring layer;

an insulating layer between the first wiring layer and the second wiring layer; and a capacitor, wherein the capacitor comprises an electrode on a same layer as the first wiring layer.

17. The display unit according to claim 16, further comprising an organic EL element over the transistor, wherein the organic EL is electrically connected to the source-drain electrode.

18. The display unit according to claim 17, further comprising a filling layer over the organic EL element, wherein a thickness of the filling layer in the display region is less than a thickness of the filling layer in the peripheral region.

19. The display unit according to claim 16, wherein the source-drain electrode is a second electrode of the capacitor.

20. The display unit according to claim 16, wherein the semiconductor layer is a second electrode of the capacitor.

* * * * *